United States Patent
Kotzur et al.

(10) Patent No.: US 11,340,989 B2
(45) Date of Patent: May 24, 2022

(54) RAID STORAGE-DEVICE-ASSISTED UNAVAILABLE PRIMARY DATA/Q DATA REBUILD SYSTEM

(71) Applicant: Dell Products L.P., Round Rock, TX (US)

(72) Inventors: Gary Benedict Kotzur, Austin, TX (US); William Emmett Lynn, Round Rock, TX (US); Kevin Thomas Marks, Georgetown, TX (US); Chandrashekar Nelogal, Round Rock, TX (US); James Peter Giannoules, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 375 days.

(21) Appl. No.: 16/586,152

(22) Filed: Sep. 27, 2019

(65) Prior Publication Data

US 2021/0096953 A1    Apr. 1, 2021

(51) Int. Cl.
*G06F 11/00*    (2006.01)
*G06F 11/10*    (2006.01)
*G06F 13/28*    (2006.01)

(52) U.S. Cl.
CPC ...... *G06F 11/1092* (2013.01); *G06F 11/1096* (2013.01); *G06F 13/28* (2013.01)

(58) Field of Classification Search
CPC ............. G06F 11/1084; G06F 11/1088; G06F 11/1092; G06F 11/1096; G06F 13/28
See application file for complete search history.

(56) References Cited

U.S. PATENT DOCUMENTS

| 5,774,641 A * | 6/1998 | Islam ................... G06F 11/1076 |
| | | 714/6.12 |
| 9,384,093 B1 * | 7/2016 | Aiello ................... G06F 3/0688 |
| 10,831,603 B2 * | 11/2020 | Kulkarni ................. G06F 3/067 |
| 10,936,420 B1 * | 3/2021 | Kotzur ................ G06F 11/1076 |

(Continued)

FOREIGN PATENT DOCUMENTS

EP    0785512 A2    7/1997

OTHER PUBLICATIONS

Ostrovsky, Igor. "How RAID-6 dual parity calculation works", igoro.com, https:/igoro.com/archive/how-raid-6-dual-parity-calculation-works/.

*Primary Examiner* — Marc Duncan
(74) *Attorney, Agent, or Firm* — Joseph Mencher

(57) ABSTRACT

A RAID storage-device-assisted unavailable primary data/Q data rebuild system includes a RAID primary data drive that receives a RAID storage controller device command and DMA's first primary data to a RAID parity data drive. The RAID parity data drive receives a RAID storage controller device command and XORs its first parity data, the first primary data, and its second primary data to produce third primary data that it writes to its storage subsystem. The RAID parity data storage device then receives a RAID storage controller device command and performs GF and XOR operations on the first primary data, the second primary data, and the third primary data to produce second Q data, and DMA's the first Q data to a RAID Q data drive. The RAID Q data storage device receives a RAID storage controller device command and writes the first Q data to its storage subsystem.

20 Claims, 22 Drawing Sheets

(56) References Cited

U.S. PATENT DOCUMENTS

| | | | |
|---|---|---|---|
| 11,023,321 B2* | 6/2021 | Kotzur | G06F 11/1076 |
| 11,023,322 B2* | 6/2021 | Kotzur | G06F 11/1096 |
| 11,074,130 B2* | 7/2021 | Shatsky | G06F 3/0619 |

* cited by examiner

RAID STORAGE-DEVICE-ASSISTED UNAVAILABLE PRIMARY DATA/Q DATA REBUILD SYSTEM

BACKGROUND

The present disclosure relates generally to information handling systems, and more particularly to performing unavailable primary data/Q data rebuild operations in an information handling system with the assistance of RAID storage devices.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems sometime utilize storage systems such as those provided by a Redundant Array of Independent Disks (RAID) storage system that includes a plurality of RAID storage devices. As will be appreciated by one of skill in the art, RAID storage systems are provided by a data storage virtualization technology that combines the physical RAID storage devices into one or more logical storage units for the purposes of data redundancy, performance improvements, and/or other benefits known in the art. For example, data in a RAID storage system may be distributed across the RAID storage devices using several different techniques that are referred to as "RAID levels" that provide different levels of redundancy and performance (e.g., RAID 0, RAID 1, RAID 5, RAID 6, and so on), with each RAID level providing a different balance among goals that include reliability, availability, performance, and capacity. However, the introduction of new storage technologies for use in RAID storage systems has been found to raise some issues.

For example, Non-Volatile Memory express (NVMe) storage devices (e.g., NVMe Solid State Drive (SSD) drives) utilize an open logical device interface specification for accessing its non-volatile storage media (e.g., provided by NAND flash memory devices) via a Peripheral Component Interconnect express (PCIe) bus to provide low latency, internal parallelism, and/or other benefits known in the art. However, NVMe storage devices present a challenge when utilized with RAID storage systems because the aggregate performance of the NVMe storage devices is typically much greater than the performance capabilities of the RAID storage controller provided for the RAID storage system (and that performance is even projected to be much greater than the performance capabilities of next-generation RAID storage controllers), which results in those RAID storage controllers being unable to manage more than a few NVMe storage devices (e.g., conventional RAID storage controllers are currently capable of managing approximately four NVMe storage devices). As such, the use of NVMe storage devices in RAID storage subsystems present RAID storage system scaling issues, as the RAID storage controllers cannot scale with more than a few NVMe storage devices.

Accordingly, it would be desirable to provide a RAID storage system that addresses the issues discussed above.

SUMMARY

According to one embodiment, an Information Handling System (IHS) includes a first Redundant Array of Independent Disk (RAID) primary data storage device that includes a first storage subsystem storing first primary data, wherein the first RAID primary data storage device is configured, in response to a first command received from a RAID storage controller device, to: write, via a first Direct Memory Access (DMA) operation to a second buffer subsystem in a RAID parity data storage device, the first primary data from the first storage subsystem; the RAID parity data storage device that includes a second storage subsystem storing first parity data and the second buffer subsystem storing the first primary data written by the first RAID primary data storage device and second primary data, wherein the RAID parity data storage device is configured, in response to a second command received from the RAID storage controller device, to: perform an XOR operation on the first parity data in the second storage subsystem and the first primary data and the second primary data in the second buffer subsystem to produce third primary data; write, to the second buffer subsystem, the third primary data; and wherein the RAID parity data storage device is configured, in response to a third command received from the RAID storage controller device, to: perform Galois Field (GF) operations on the first primary data, the second primary data, and the third primary data in the second buffer subsystem to produce first GF primary data, second GF primary data, and third GF primary data; perform an XOR operation on the first GF primary data, second GF primary data, and third GF primary data to produce second Q data; and write, via a third DMA operation to a fourth buffer subsystem in a RAID Q data storage device, the first Q data; and the RAID Q data storage device that includes a third storage subsystem and the fourth buffer subsystem storing the first Q data written by the RAID parity data storage device, wherein the RAID Q data storage device is configured, in response to a fourth command received from the RAID storage controller device, to: write, to the third storage subsystem, the first Q data from the fourth buffer subsystem.

BRIEF DESCRIPTION OF THE DRAWINGS

FIG. 100 is a schematic view illustrating an embodiment of the RAID storage system of FIG. 2 operating during the method of FIGS. 4A and 4B.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
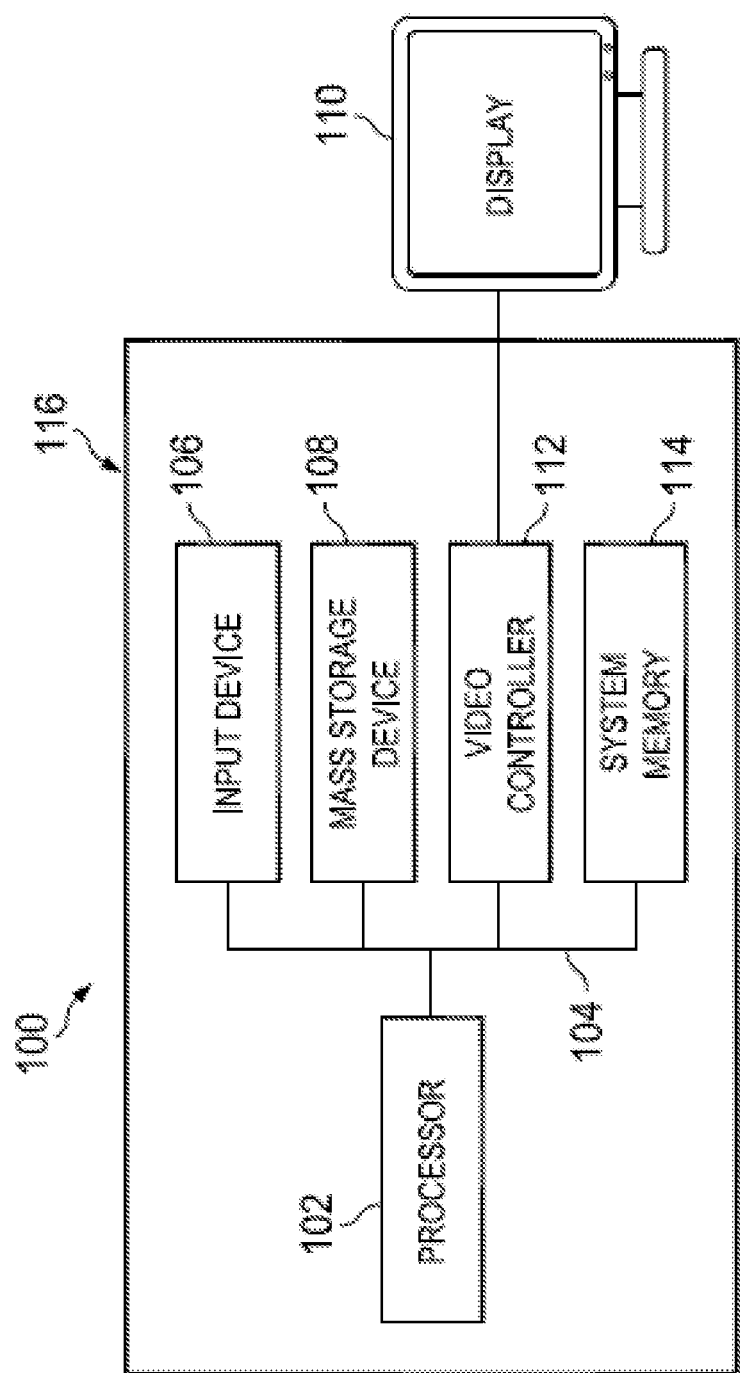
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
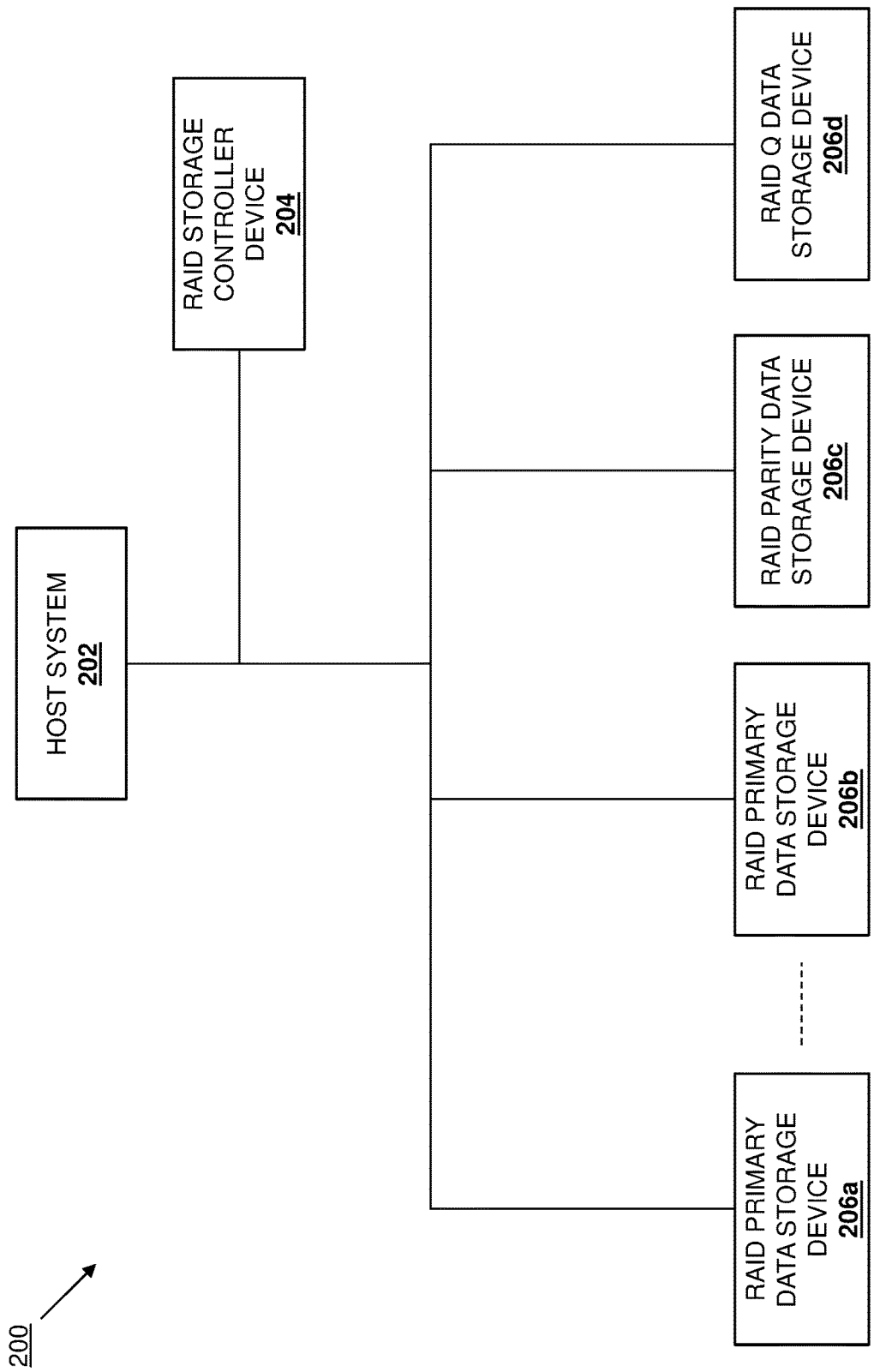
FIG. 2 is a schematic view illustrating an embodiment of a RAID storage system.

Referring now to FIG. 2, an embodiment of a Redundant Array of Independent Disks (RAID) storage system 200 is illustrated. In the illustrated embodiment, the RAID storage system 200 incudes a host system 202. In an embodiment, the host system 202 may be provided by the IHS 100 discussed above with reference to FIG. 1, and/or may include some or all of the components of the IHS 100. For example, the host system 202 may include server device(s), desktop computing device(s), a laptop/notebook computing device(s), tablet computing device(s), mobile phone(s), and/or any other host devices that one of skill in the art in possession of the present disclosure would recognize as operating similarly to the host system 202 discussed below. In the illustrated embodiment, the RAID storage system 200 also includes a RAID storage controller system 204 that is coupled to the host system 202 and that may be provided by the IHS 100 discussed above with reference to FIG. 1, and/or may include some or all of the components of the IHS 100. For example, the RAID controller system 204 may include any storage device/disk array controller device that is configured to manage physical storage devices and present them to host systems as logical units.

Furthermore, the RAID storage system 200 also includes a plurality of RAID storage devices that are illustrated in FIG. 2 as a plurality of RAID primary data storage devices 206a and up to 206b, a RAID parity storage data device 206c, and a RAID Q data storage device 206d, each of which is coupled to the host system 202 and the RAID storage controller system 204. As will be appreciated by one of skill in the art in possession of the present disclosure, the RAID storage device in the RAID storage system 200 of FIG. 2 are in a RAID 6 configuration, with the RAID primary data storage devices 206a and up to 206b configured to store primary data (e.g., provided by the host system 202), the RAID parity data storage device 206c configured to store parity data that may be utilized to recover primary data when that primary data becomes unavailable on a RAID primary data storage device, and the RAID Q data storage device 206c configured to store Q data that may be utilized to recover primary data when that primary data becomes unavailable on a RAID primary data storage device.

However, while a few RAID storage devices in a particular configuration are illustrated, one of skill in the art in possession of the present disclosure will recognize that many more storage devices may (and typically will) be coupled to the RAID storage controller system 204 (e.g., in a datacenter) and may be provided in other RAID configurations while remaining within the scope of the present disclosure. In the embodiments discussed below, the RAID storage devices 206a-206d are described as being provided by Non-Volatile Memory express (NVMe) Solid State Drive (SSD) drives, but one of skill in the art in possession of the present disclosure will recognize that other types of storage devices with similar functionality as the NVMe SSD drives (e.g., NVMe PCIe add-in cards, NVMe M.2 cards, etc.) may be implemented according to the teachings of the present disclosure and thus will fall within its scope as well. While a specific RAID storage system 200 has been illustrated and described, one of skill in the art in possession of the present disclosure will recognize that the RAID storage system of the present disclosure may include a variety of components and component configurations while remaining within the scope of the present disclosure as well.

Figure 3:
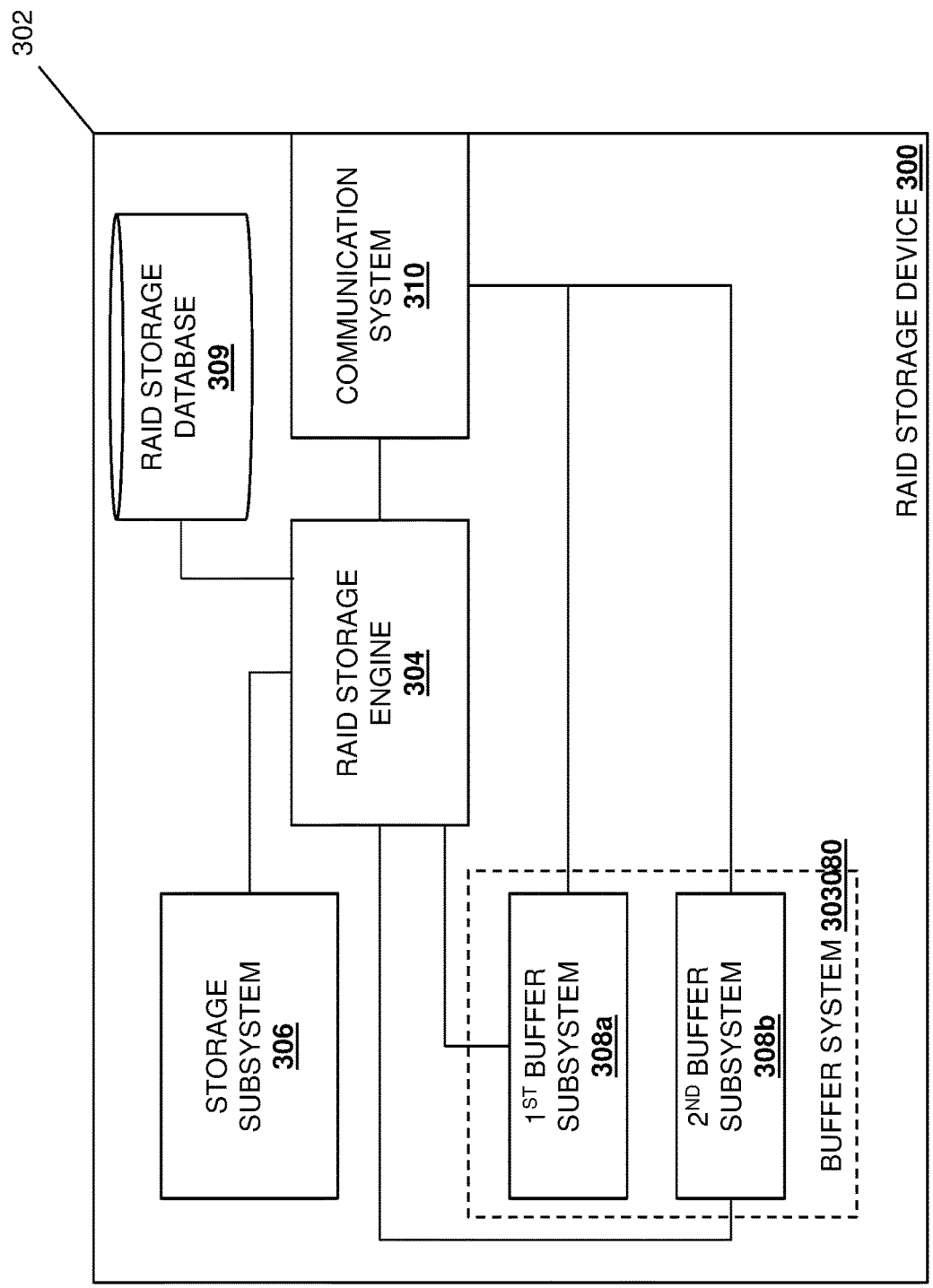
FIG. 3 is a schematic view illustrating an embodiment of a RAID storage device that may be provided in the RAID storage system of FIG. 2.

Referring now to FIG. 3, an embodiment of a RAID storage device 300 is illustrated that may provide any or all of the RAID primary data storage devices 206a-206b, the RAID parity data storage device 206c, and/or the RAID Q data storage device 206d discussed above with reference to FIG. 2. As such, the RAID storage device 300 may be provided by an NVMe SSD storage devices, but one of skill in the art in possession of the present disclosure will recognize that other types of storage devices with similar functionality as the NVMe SSD storage devices (e.g., NVMe PCIe add-in cards, NVMe M.2 cards, etc.) may be implemented according to the teachings of the present disclosure and thus will fall within its scope as well. In the illustrated embodiment, the RAID storage device 300 includes a chassis 302 that houses the components of the RAID storage device 300, only some of which are illustrated below. For example, the chassis 302 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a RAID storage engine 304 that is configured to perform the functionality of the RAID storage engines and/or RAID storage devices discussed below. While not illustrated, one of skill in the art in possession of the present disclosure will recognize that the RAID storage engine 304 may include, or be coupled to, other components such as a queues (e.g., the submission queues and completion queues discussed below) and/or RAID storage device components that would be apparent to one of skill in the art in possession of the present disclosure.

The chassis 302 may also house a storage subsystem 306 that is coupled to the RAID storage engine 304 (e.g., via a coupling between the storage subsystem 306 and the processing system). Continuing with the example provided above in which the RAID storage device 300 is an NVMe SSD storage device, the storage subsystem 306 may be provided by a flash memory array such as, for example, a plurality of NAND flash memory devices. However, one of skill in the art in possession of the present disclosure will recognize that the storage subsystem 306 may be provided using other storage technologies while remaining within the scope of the present disclosure as well. The chassis 302 may also house a buffer system 308 that includes a first buffer subsystem 308a that is coupled to the RAID storage engine 304 (e.g., via a coupling between the first buffer subsystem 308a and the processing system), and a second buffer subsystem 308b that is coupled to the RAID storage engine 304 (e.g., via a coupling between the second buffer subsystem 308b and the processing system). For example, the buffer system 308 may be provided by one or more buffer memory devices that include a first set of memory address ranges that provide the first buffer subsystem 308a, and a second set of memory address ranges that provide the second buffer subsystem 308b. Continuing with the example provided above in which the RAID storage device 300 is an NVMe SSD storage device, the first buffer subsystem 308a may be provided by a portion of the buffer system 308 that is often referred to as the "device buffer". However, one of skill in the art in possession of the present disclosure will recognize that the first buffer subsystem 308a may be provided using other buffer technologies while remaining within the scope of the present disclosure as well.

Similarly, continuing with the example provided above in which the RAID storage device 300 is an NVMe SSD storage device, the second buffer subsystem 308b may be provided by a portion of the buffer system 308 that is often referred to as the "Controller Memory Buffer (CMB)", "scratchpad buffer", or "cache buffer". In an embodiment, the second buffer subsystem 308b/CMB may be provided by a subset of the buffer system 308 that is distinguished from the first buffer subsystem 308a/device buffer. For example, the second set of memory address ranges in the buffer memory device(s) that provide the second buffer subsystem 308b/CMB may be mapped to the PCIe memory space of the host system 202, which one of skill in the art in possession of the present disclosure will recognize makes the second buffer subsystem 308b/CMB visible to the host system 202 while the rest of the buffer system 308 (e.g., the first buffer subsystem 308a/device buffer) is not (i.e., due to the first set of memory address ranges in the buffer memory device(s) that provide the first buffer subsystem 308a/device buffer not being mapping to the PCIe memory space of the host system 202.) As will be appreciated by one of skill in the art in possession of the present disclosure, mapping the second buffer subsystem 308b/CMB to the PCIe memory space of the host system 202 allows for the second buffer subsystem 308b/CMB to be the target of the Direct Memory Access (DMA) data operation discussed below. However, one of skill in the art in possession of the present disclosure will recognize that the second buffer subsystem 308b may be provided using other buffer technologies while remaining within the scope of the present disclosure as well. The chassis 302 may also house a storage system (not illustrated, but which may be provided by the storage device 108 discussed above with reference to FIG. 1) that is coupled to the RAID storage engine 304 (e.g., via a coupling between the storage system and the processing system) and that includes a RAID storage database 309 that is configured to storage any of the information utilized by the RAID storage engine 304 as discussed below.

The chassis 302 may also house a communication system 310 that is coupled to the RAID storage engine 304 (e.g., via a coupling between the communication system 310 and the processing system), the first buffer subsystem 308*a*, and the second buffer subsystem 308*b*, and that may be provided by any of a variety of storage device communication technologies and/or any other communication components that would be apparent to one of skill in the art in possession of the present disclosure. Continuing with the example provided above in which the RAID storage device 300 is an NVMe SSD storage device, the communication system 310 may include any NVMe SSD storage device communication components that enable the Direct Memory Access (DMA) operations described below, as well as any other NVMe SDD storage device communication functionality that would be apparent to one of skill in the art in possession of the present disclosure. While a specific RAID storage device 300 has been illustrated, one of skill in the art in possession of the present disclosure will recognize that RAID storage devices (or other devices operating according to the teachings of the present disclosure in a manner similar to that described below for the RAID storage device 300) may include a variety of components and/or component configurations for providing conventional RAID storage device functionality, as well as the functionality discussed below, while remaining within the scope of the present disclosure as well.

Figure 4A:
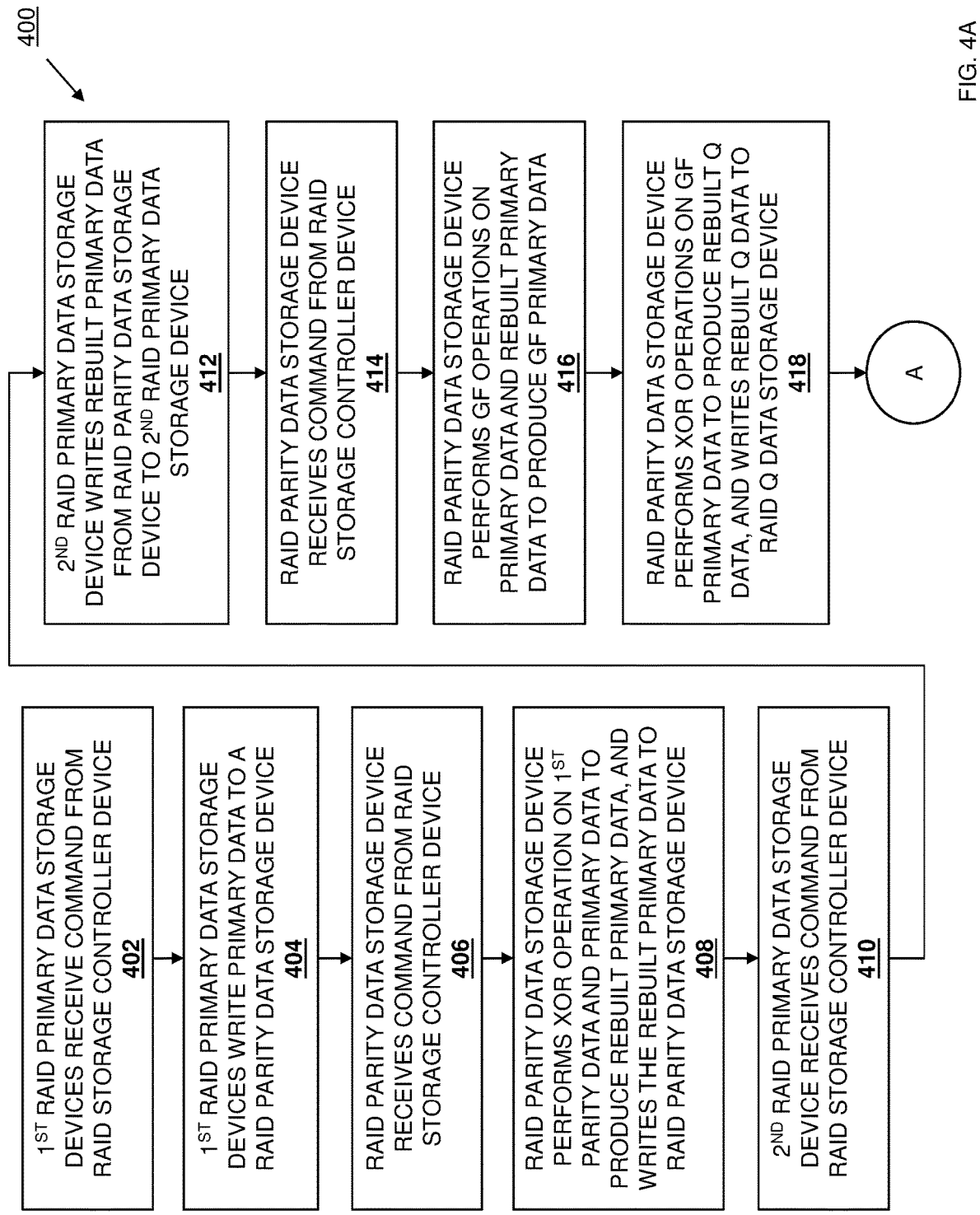
FIG. 4A is a flow chart illustrating an embodiment of a portion of a method for assisting with unavailable primary data/Q data rebuild operations using RAID storage devices.
Figure 4B:
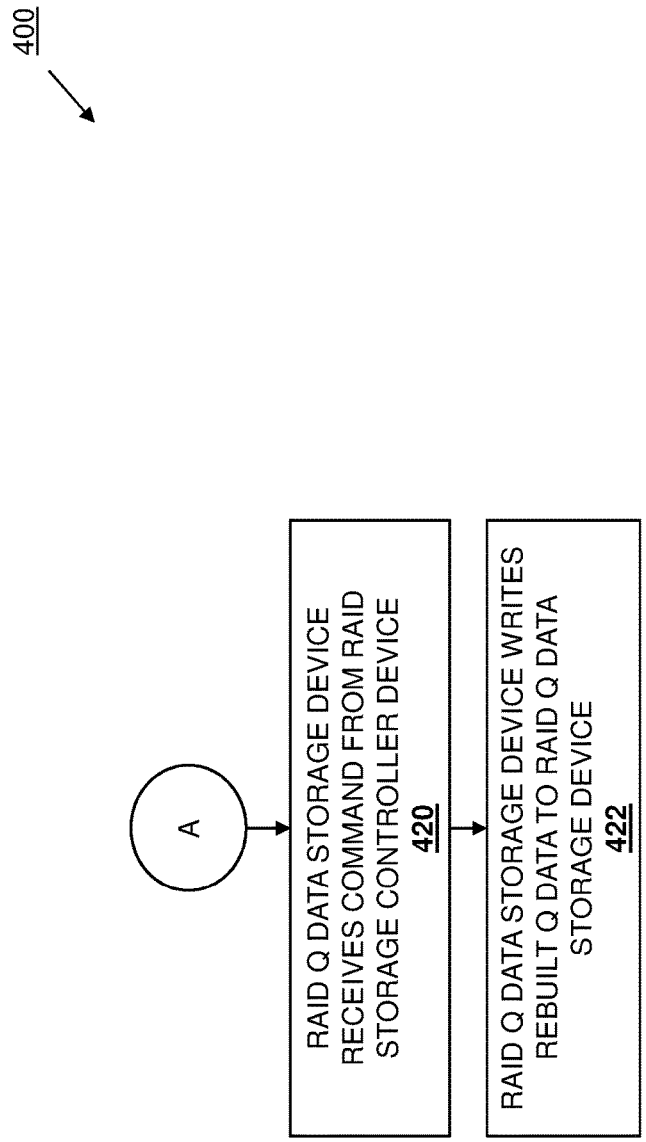
FIG. 4B is a flow chart illustrating an embodiment of a portion of a method for assisting with unavailable primary data/Q data rebuild operations using RAID storage devices.

Referring now to FIGS. 4A and 4B, an embodiment of a method 400 for assisting with unavailable primary data/Q data rebuild operations using RAID storage devices is illustrated. As discussed below, the systems and methods of the present disclosure provide for the performance of unavailable primary data/Q data rebuild operations to rebuild and backup data in a RAID storage system with the assistance of the RAID storage devices that store that data. For example, a first RAID primary data storage device may receive a command from a RAID storage controller device and, in response, may provide primary data to a first buffer subsystem in RAID parity data storage device via first Direct Memory Access (DMA) operations. The RAID parity data storage device may then receive a command from the RAID storage controller device and, in response, may perform an XOR operation on first parity data in a first storage subsystem in the RAID parity data storage device and the primary data in the first buffer subsystem to produce rebuilt primary data, and write the rebuilt primary data to the first buffer subsystem. A second RAID primary data storage device may then receive a third command from the RAID storage controller device and, in response, may retrieve the rebuilt primary data from the first buffer subsystem in the RAID parity data storage device via a second DMA operation, and write that rebuilt primary data to a second storage subsystem in the second RAID primary data storage device. The RAID parity data storage device may then receive a fourth command from the RAID storage controller device and, in response, may perform Galois Field (GF) operations on the rebuilt primary data and other primary data in the first buffer subsystem to produce GF primary data, perform an XOR operation on the GF primary data to produce Q data, and write the Q data to a third buffer subsystem in a RAID Q data storage device. The RAID Q data storage device may then receive a fifth command from the RAID storage controller device and, in response, may provide the Q data in a third storage subsystem in the RAID Q data storage device. As such, unavailable primary data may be rebuilt, and in the event Q data is also unavailable, the RAID storage subsystem may take advantage of the available and rebuilt primary data to rebuilt that unavailable Q data as well, with the unavailable primary data/Q data rebuilt operations offloaded from the RAID storage controller device, thus increasing the ability of the RAID storage controller device to scale with high performance RAID storage devices.

Figure 5:
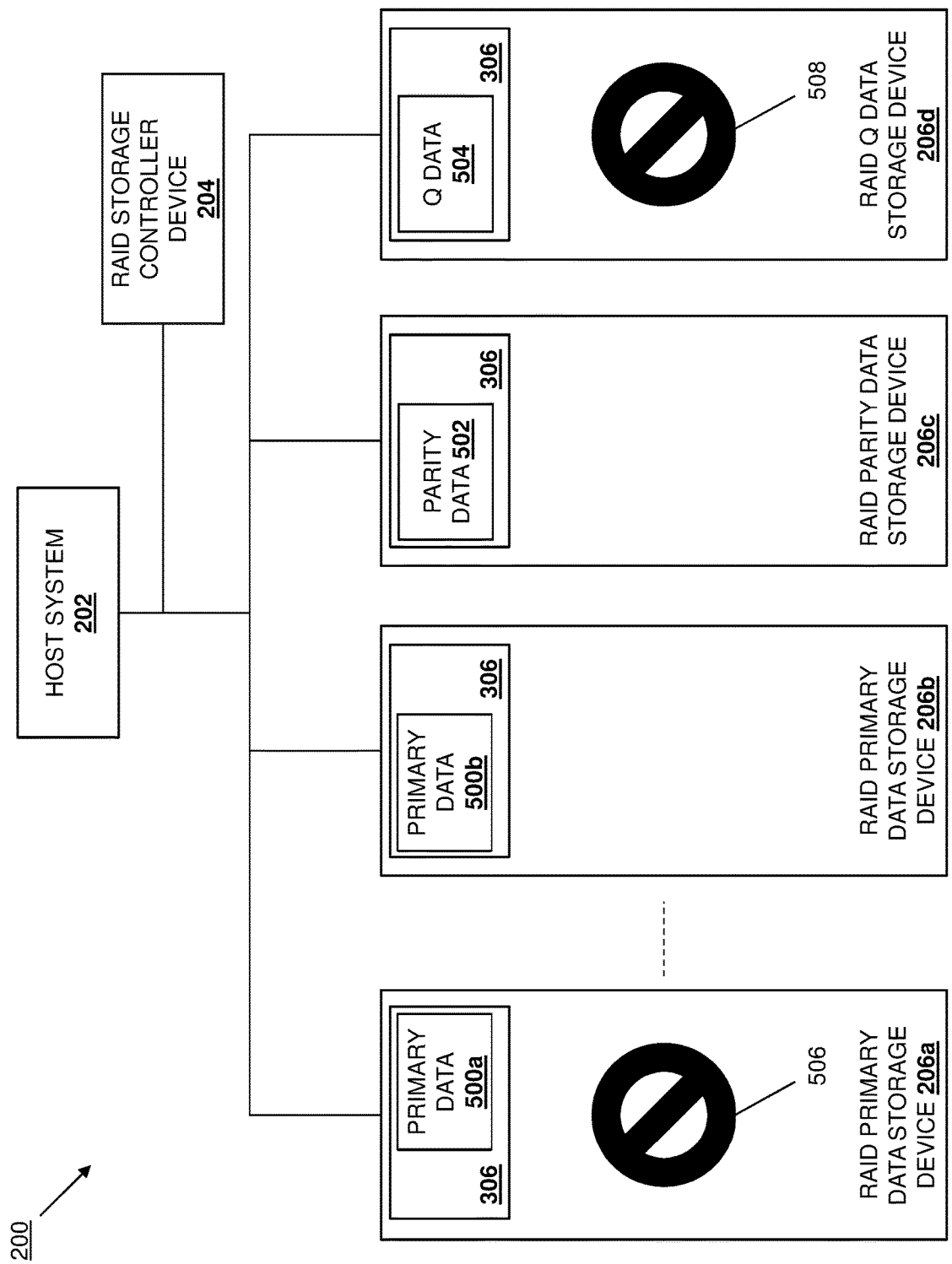
FIG. 5 is a schematic view illustrating an embodiment of the RAID storage system of FIG. 2 operating during the method of FIGS. 4A and 4B.

With reference to FIG. 5, the RAID storage system 200 is illustrated with the RAID primary storage device 206*a* storing primary data 500*a* in its storage subsystem 306, and the RAID primary data storage device 206*b* storing primary data 500*b* in its storage subsystem 306. While only two RAID primary data storage devices are illustrated and described in the examples provided below, one of skill in the art in possession of the present disclosure will recognize that any number of RAID primary data storage devices may store primary data while remaining within the scope of the present disclosure as well. In addition, the RAID storage system 200 is also illustrated with the RAID parity data storage device 206*c* storing parity data 502 in its storage subsystem 306, and one of skill in the art in possession of the present disclosure will recognize that the parity data 502 may have been generated via an XOR operation performed on the primary data 500*a*-500*b* in the RAID primary data storage devices 206*a*-206*b*, and allows for the rebuilding of any primary data stored on any one RAID primary data storage device in the event that primary data/RAID primary data storage device becomes unavailable.

Furthermore, the RAID storage system 200 is also illustrated with the RAID Q data storage device 206*c* storing Q data 504 in its storage subsystem 306, and one of skill in the art in possession of the present disclosure will recognize that the Q data 504 may have been generated via Galois Field (GF) and XOR operations performed on the primary data 500*a*-500*b* in the RAID primary data storage devices 206*a*-206*b*, and allows for the rebuilding of any primary data, and in some cases parity data, stored on any two RAID storage devices (e.g., RAID primary data storage device(s) 206*a*-206*b* and, in some cases, the RAID parity data storage device 206*b*) in the event that data/those RAID storage devices become unavailable. As will also be appreciated by one of skill in the art in possession of the present disclosure, the primary/parity/Q data storage configuration illustrated in FIG. 5 provides primary/parity/Q data for a single data stripe, and different data stripes may have different primary/parity/Q data storage configurations (e.g., in a plurality of RAID storage devices provided in a RAID storage system, a first data stripe may include primary data on first and second RAID storage device, parity data on a third RAID storage device, and Q data on a fourth RAID storage device; a second data stripe may include primary data on the second and third RAID storage device, parity data on the fourth RAID storage device, and Q data on the first RAID storage device; a third data stripe may include primary data on the third and fourth RAID storage device, parity data on the first RAID storage device, and Q data on the second RAID storage device, etc.) As such, while a particular RAID storage system device and data configuration is illustrated for purposes of the examples below, one of skill in the art in possession of the present disclosure will recognize that a variety of device and data configurations will fall within the scope of the present disclosure as well.

The embodiment illustrated in FIG. 5, the primary data 500a in the storage subsystem 306 in the RAID primary data storage device 206a has become unavailable due to an unavailability (e.g., a failure) of the RAID primary data storage device 206a (as illustrated by element 506 in FIG. 5), and the Q data 504 in the storage subsystem 306 in the RAID Q data storage device 206d has become unavailable due to an unavailability (e.g., a failure) of the RAID Q data storage device 206a (as illustrated by element 508 in FIG. 5.) As will be appreciated by one of skill in the art in possession of the present disclosure, the RAID 6 configuration of the RAID storage system 200 allows for the recovery of unavailable data on two unavailable (e.g., failed) RAID storage devices. However, one of skill in the art in possession of the present disclosure will also recognize that data on RAID storage devices may become unavailable for a variety of reasons (e.g., other than the failure of their associated RAID storage device), and those unavailable data situations will fall within the scope of the present disclosure as well. As such, data unavailability in a variety of different data and device configurations will benefit from the teachings of the present disclosure, and thus is envisioned as falling within its scope.

Figure 6A:
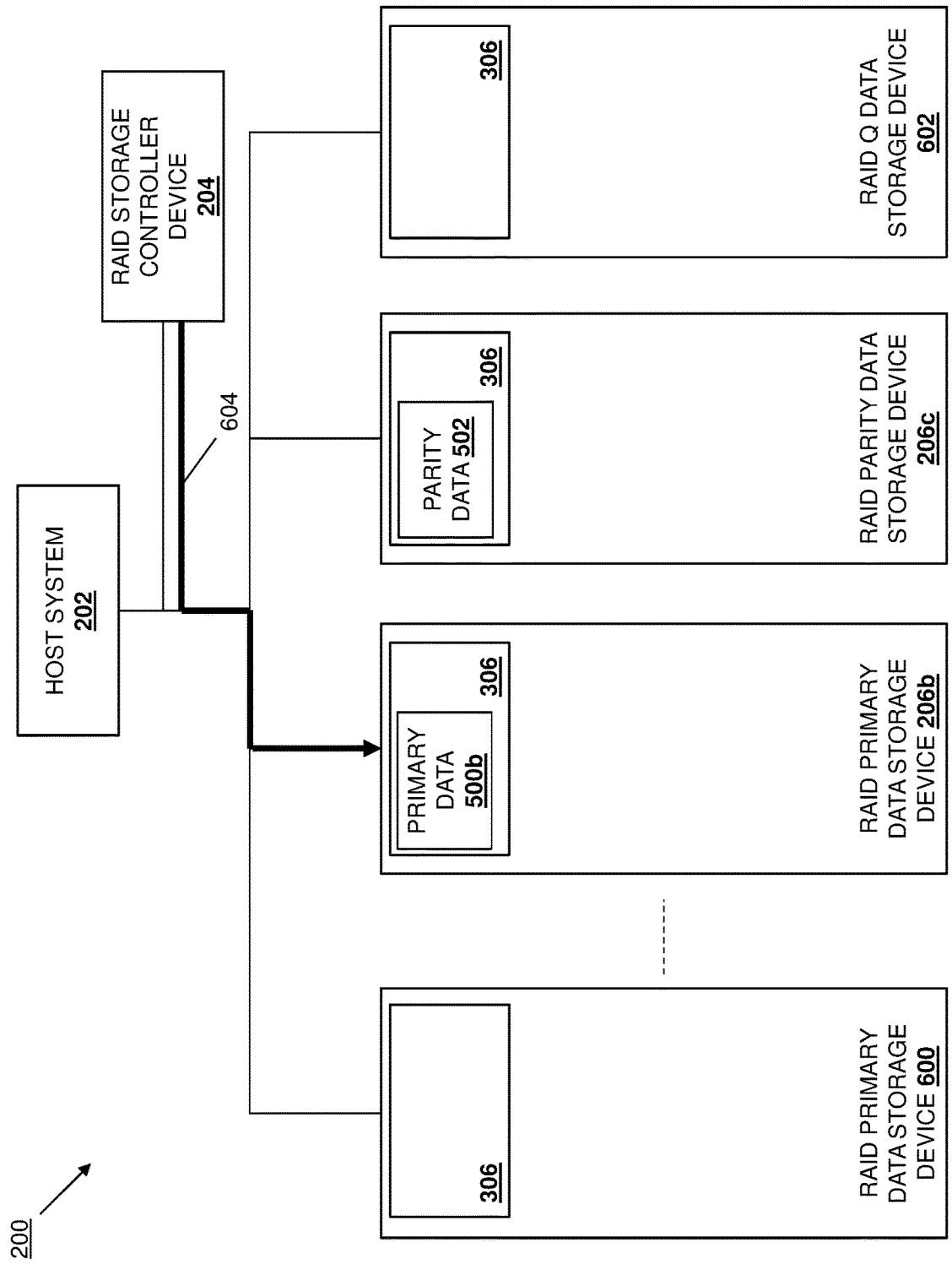
FIG. 6A is a schematic view illustrating an embodiment of the RAID storage system of FIG. 2 operating during the method of FIGS. 4A and 4B.

The method 400 begins at block 402 where a first RAID primary data storage device receives a command from a RAID storage controller device. With reference to FIG. 6A, an example is illustrated in which the RAID primary data storage device 206a that has failed has been replaced with a RAID primary data storage device 600, and the RAID Q data storage device 206d that has failed has been replaced with a RAID Q data storage device 602. As such, the storage subsystem 306 in the RAID primary data storage device 600 does not include the primary data 500a that was stored in the RAID primary data storage device 206a, and the RAID Q data storage device 602 does not include the Q data 504 that was stored in the RAID Q data storage device 206d. In an embodiment, at block 402, the RAID storage controller device 204 may generate and transmit a command to a RAID primary data storage device.

With reference to FIG. 6A, the RAID storage controller device 204 may identify (or be informed of) the unavailability of the primary data 500a and the Q data 504 and, in response, may generate and transmit a copy command to each of the RAID primary data storage devices that are available at block 402. As will be appreciated by one of skill in the art in possession of the present disclosure, the RAID storage controller device 204 may identify (or be informed of by a RAID storage system administrator) the primary data and Q data unavailability, the RAID primary data storage device 206a and RAID Q data storage device 206d unavailability, the replacement of the RAID primary data storage device 206a and RAID Q data storage device 206d with the RAID primary data storage device 600 and RAID Q data storage device 602, respectively, and/or may identify the data availability via any other techniques that identify the need for the primary data/Q data rebuild operations discussed below. As such, at block 402, the RAID storage controller device 204 may identify any available RAID primary data storage devices (e.g., the RAID primary data storage device 206b in the illustrated embodiment, as well as any other available RAID primary data storage devices), and may generate a command 604 and transmit the command 604 to each of those available RAID primary data storage devices (e.g., RAID primary data storage device 206b in the illustrated embodiment.) As such, while not illustrated, one of skill in the art in possession of the present disclosure will recognize that commands similar to the command 604 may be generated and transmitted to each RAID primary data storage device that is available at block 402.

In some embodiments, the command 604 may be a multi-operation command like those described in U.S. patent application Ser. No. 16/585,296, filed on Sep. 27, 2019. For example, the command 604 may be an NVMe COPY multi-operation command that is configured to cause the RAID primary data storage device 206b to perform the multiple operations described below. However, while described as providing a multi-operation command at block 402, one of skill in the art in possession of the present disclosure will recognize that the multiple operations performed by the RAID primary data storage device 206b discussed below may be performed in response to respective commands transmitted by the RAID storage controller device 204 while remaining within the scope of the present disclosure as well. In a specific example, the transmission of the command 604 may include the RAID storage controller device 204 providing the command 604 in a submission queue that is included in the communication system 310 in the RAID primary data storage device 206b/300, and then ringing a doorbell for the RAID primary data storage device 206b/300. However, one of skill in the art in possession of the present disclosure will recognize that the command 604 may be provided to the RAID primary data storage device 206b in a variety of manners that will fall within the scope of the present disclosure as well.

As such, in some examples the RAID storage engine 304 in the RAID primary data storage device 206b/300 may respond to the ringing of its doorbell by accessing the command 604 in the submission queue in its communication system 310. In embodiments in which the command 604 is a multi-operation command, the RAID storage engine 304 in the RAID primary data storage device 206b/300 may identify the multiple operations instructed by that command 604 (as described in U.S. patent application Ser. No. 16/585,296, filed on Sep. 27, 2019.) However, while a single RAID primary data storage device is illustrated and described below as receiving the command 604 that causes it to copy its primary data 500b to the RAID parity data storage device 206c, discussed below, one of skill in the art in possession of the present disclosure will recognize how multiple RAID primary storage devices may receive similar commands at block 402 and subsequently perform similar functions while remaining within the scope of the present disclosure as well.

Figure 6B:
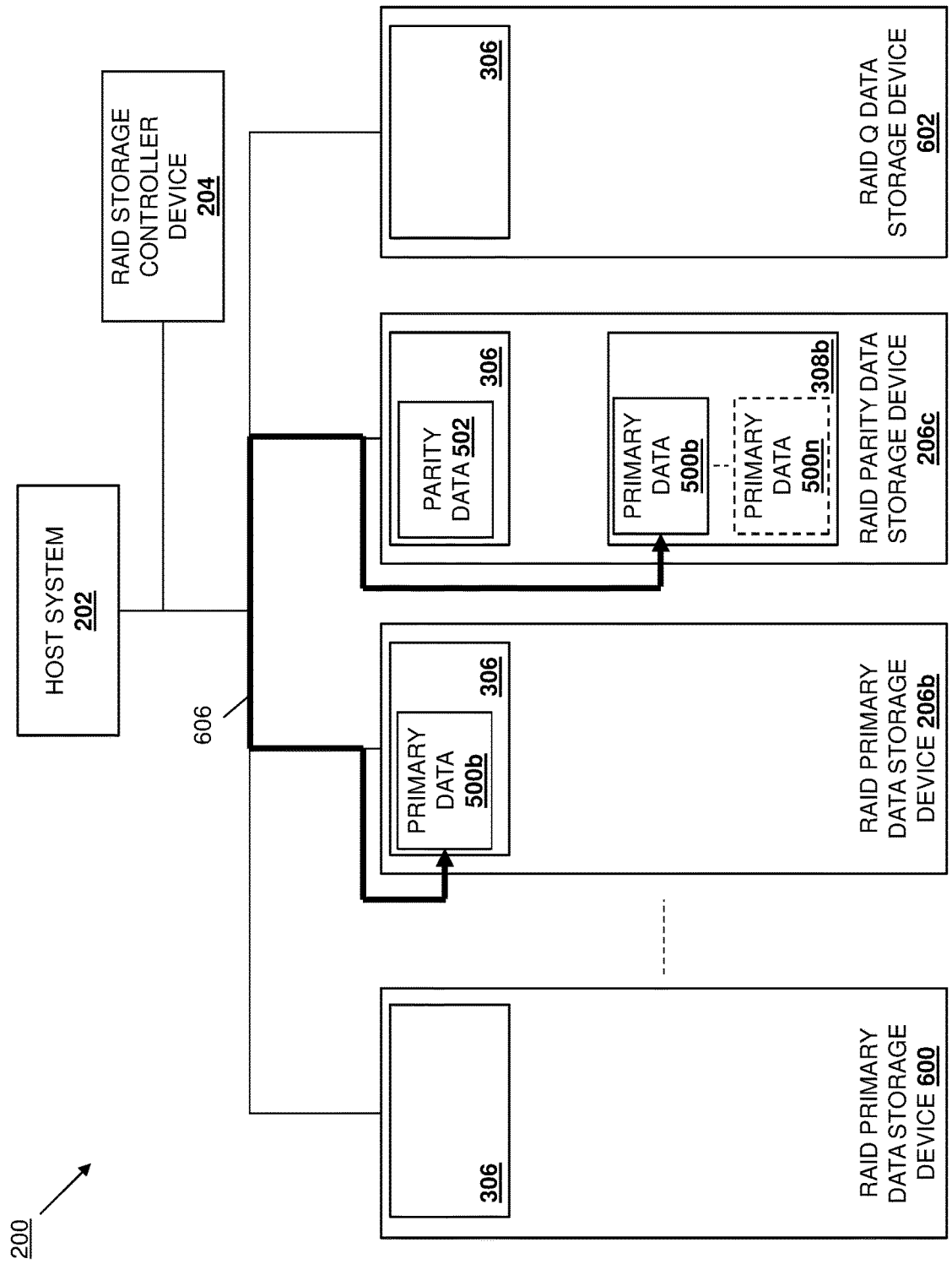
FIG. 6B is a schematic view illustrating an embodiment of the RAID storage system of FIG. 2 operating during the method of FIGS. 4A and 4B.

The method 400 then proceeds to block 404 where the RAID primary data storage device provides its primary data to a RAID parity data storage device. With reference to FIG. 6B, in an embodiment of block 404 and based on the command 604 (which is a multi-operation command as described above in this embodiment), the RAID storage engine 304 in the RAID primary data storage device 206b/300 may operate to perform a Direct Memory Access (DMA) operation 606 that accesses primary data 500b that is stored in its storage subsystem 306, and copies that primary data 500b to the second buffer subsystem 308b (e.g., a CMB) in the RAID parity data storage device 206c. As will be appreciated by one of skill in the art in possession of the present disclosure, the primary data 500b may be a portion of a data stripe that included the primary data 500a that became unavailable due to the failure of the RAID primary data storage device 206a, although other primary data copying scenarios will fall within the scope of the present disclosure as well. Furthermore, FIG. 6B illustrates how, in addition to the primary data 500b, the RAID parity data storage device 206c may store up to primary data 500n that may be provided by the other RAID primary data storage devices that are available. As such, each available RAID primary data storage device that is available at block 404 may operate to copy its primary data to the second buffer subsystem 308b in the RAID parity data storage device 206c in substantially the same manner as described above for the RAID primary data storage device 206b.

Figure 6C:
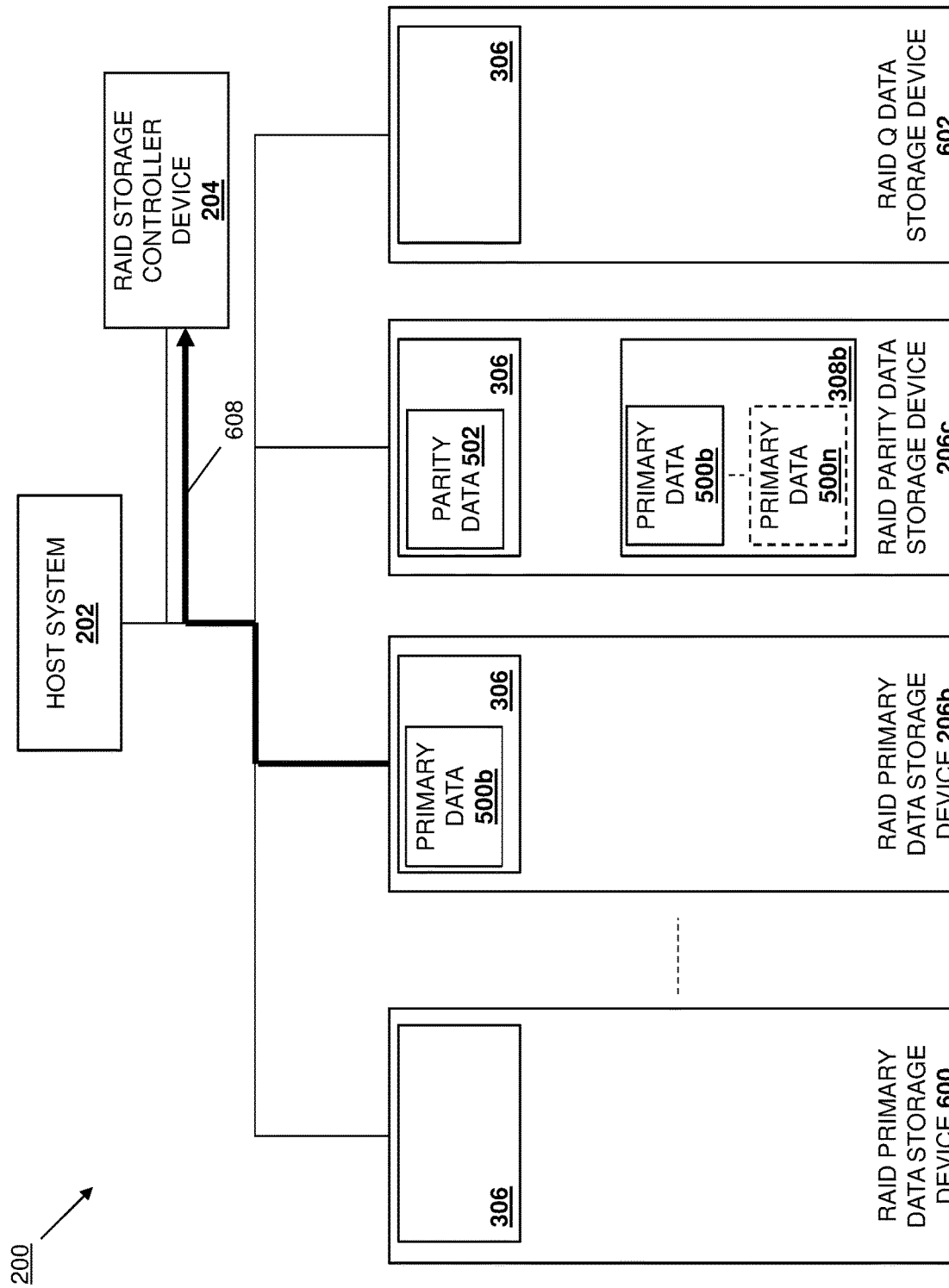
FIG. 6C is a schematic view illustrating an embodiment of the RAID storage system of FIG. 2 operating during the method of FIGS. 4A and 4B.

With reference to FIG. 6C, following completion of the operations associated with the command 604 (e.g., multiple operations associated with a multi-operation command as discussed above, following each operation associated with respective commands, etc.) the RAID storage engine 304 in the RAID primary data storage device 206b/300 may generate and transmit a completion message 608 to the RAID storage controller device 204. For example, the RAID storage engine 304 in the RAID primary data storage device 206b/300 may generate the completion message 608 and provide that completion message in a completion queue in its communication system 310, and then generate an interrupt to the RAID storage controller device 204 that causes the RAID storage controller device 204 to access that completion queue and retrieve the completion message. However, while a specific technique for transmitting the completion message is described, one of skill in the art in possession of the present disclosure will recognize that completion messages may be transmitted using a variety of other techniques while remaining within the scope of the present disclosure. Furthermore, one of skill in the art in possession of the present disclosure will recognize that other RAID primary data storage devices performing similar primary data copy operations (as discussed above) may transmit similar completion messages to the RAID storage controller device 204 following their update operations (e.g., the multiple operations in the NVMe COPY multi-operation command discussed above), and the RAID storage controller device 204 may wait to receive completion messages from each currently available RAID primary data storage device prior to proceeding with the method 400.

The method 400 then proceeds to block 406 where the RAID parity data storage device receives a command from the RAID storage controller device. In an embodiment, at block 406, the RAID storage controller device 204 may generate and transmit a command to a RAID parity data storage device. For example, and as discussed above, the RAID storage controller device 204 may determine that completion messages from each currently available RAID primary data storage device have been received as discussed above and, in response, at block 406 the RAID storage controller device 204 may generate a command 700 and transmit the command 700 to the RAID parity data storage device 206c.

Similarly as discussed above, the command 700 may be a multi-operation command like those described in U.S. patent application Ser. No. 16/585,296, filed on Sep. 27, 2019. For example, the command 700 may be an NVMe RAID 5 REBUILD multi-operation command that is configured to cause the RAID parity data storage device 206c to perform the multiple operations described below. However, while described as providing a multi-operation command at block 406, one of skill in the art in possession of the present disclosure will recognize that the multiple operations performed by the RAID parity data storage device 206c discussed below may be performed in response to respective commands transmitted by the RAID storage controller device 204 while remaining within the scope of the present disclosure as well. In a specific example, the transmission of the command 700 may include the RAID storage controller device 204 providing the command 700 in a submission queue that is included in the communication system 310 in the RAID parity data storage device 206c/300, and then ringing a doorbell for the RAID parity data storage device 206c/300. However, one of skill in the art in possession of the present disclosure will recognize that the command 700 may be provided to the RAID parity data storage device 206c in a variety of manners that will fall within the scope of the present disclosure as well.

As such, in some examples the RAID storage engine 304 in the RAID parity data storage device 206c/300 may respond to the ringing of its doorbell by accessing the command 700 in the submission queue in its communication system 310. In embodiments in which the command 700 is a multi-operation command, the RAID storage engine 304 in the RAID parity data storage device 206c/300 may identify the multiple operations instructed by that command 700 (as described in U.S. patent application Ser. No. 16/585,296, filed on Sep. 27, 2019.)

Figure 7A:
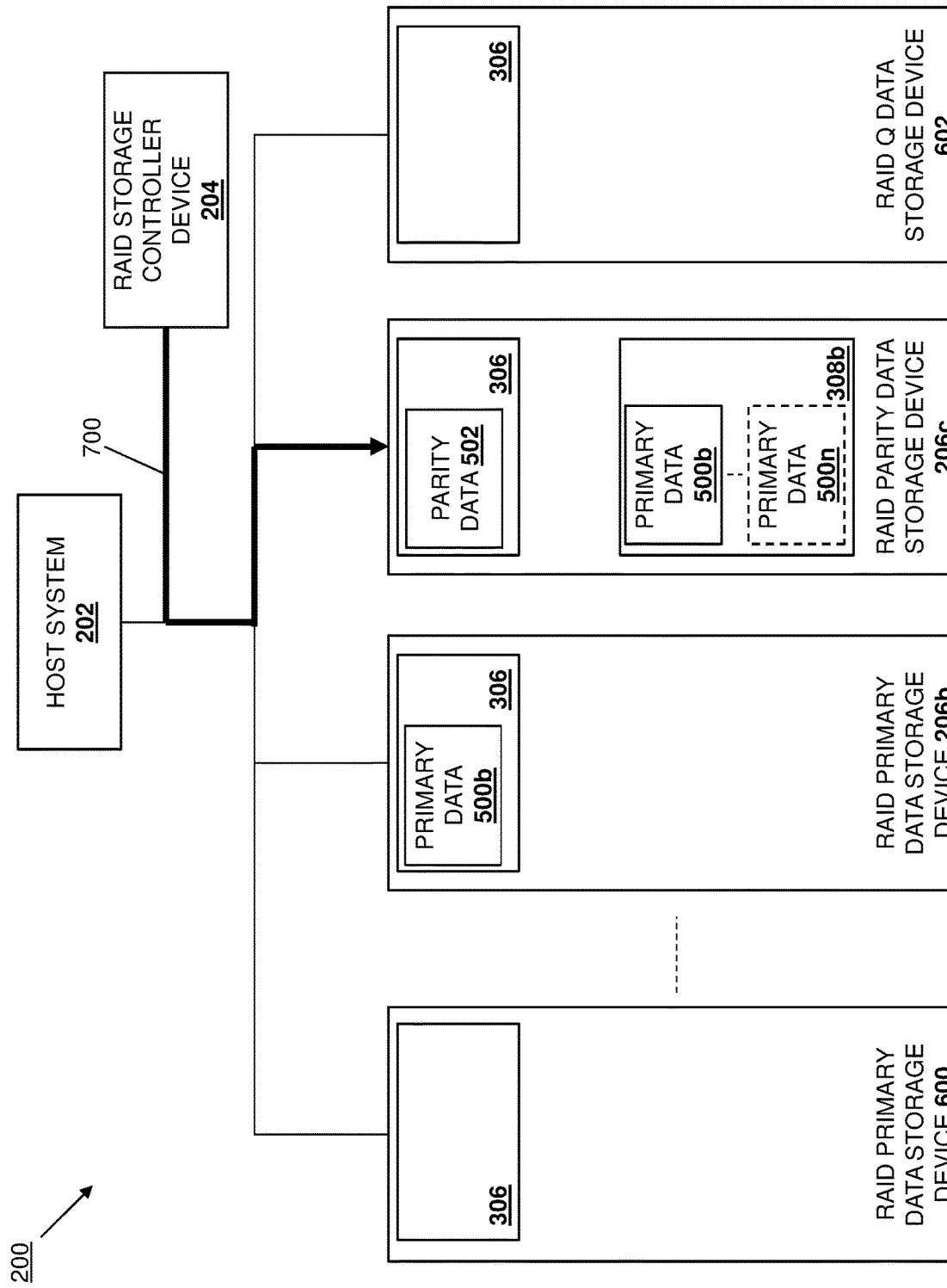
FIG. 7A is a schematic view illustrating an embodiment of the RAID storage system of FIG. 2 operating during the method of FIGS. 4A and 4B.
Figure 7B:
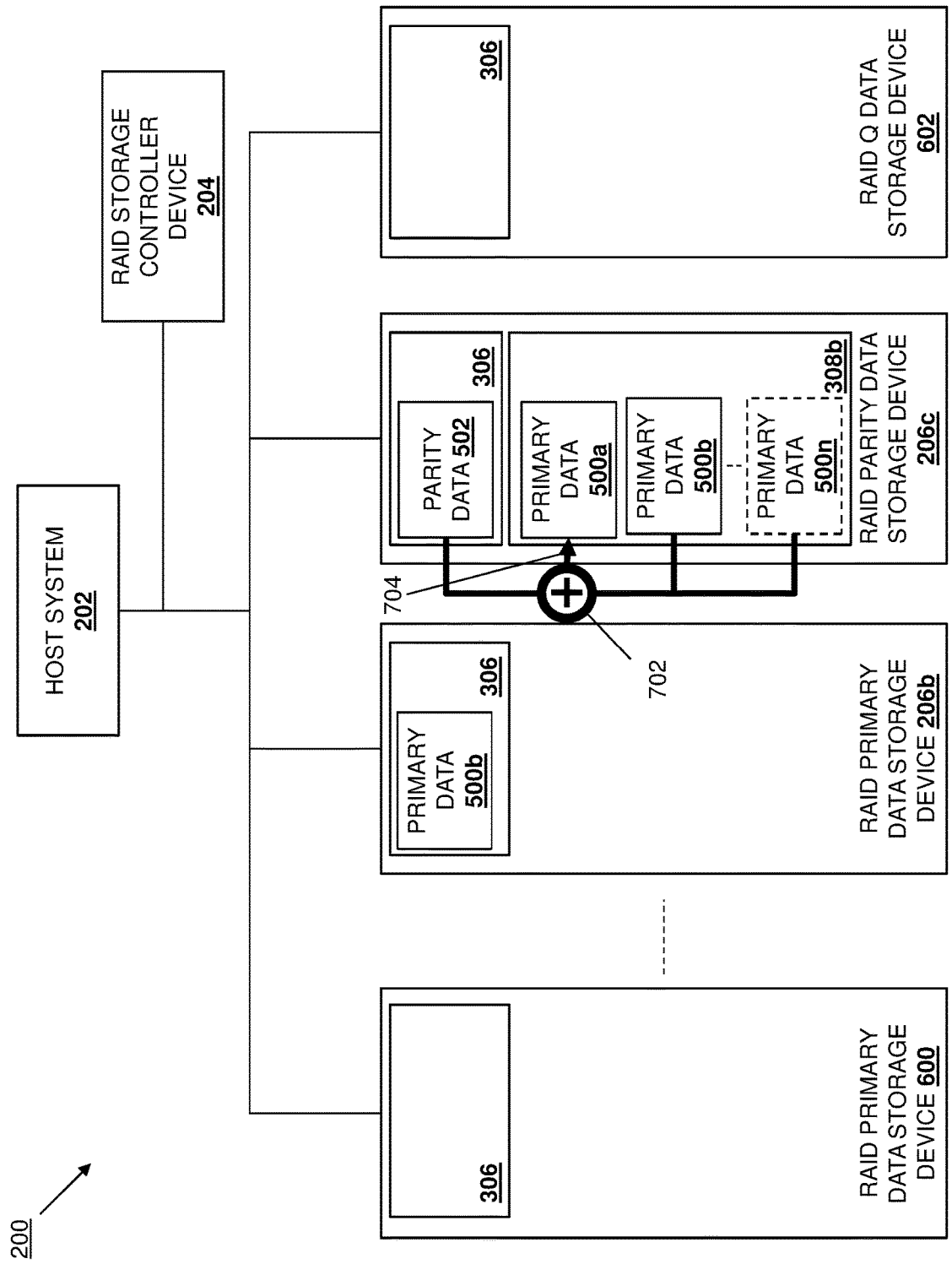
FIG. 7B is a schematic view illustrating an embodiment of the RAID storage system of FIG. 2 operating during the method of FIGS. 4A and 4B.

The method 400 then proceeds to block 408 where the RAID parity data storage device performs an XOR operation on first parity data and primary data to produce rebuilt primary data, and writes the rebuilt primary data to its buffer subsystem. With reference to FIG. 7B, in an embodiment of block 408 and based on the command 700 (which is a multi-operation command as described above in this embodiment), the RAID storage engine 304 in the RAID parity data storage device 206c/300 may operate to perform an XOR operation 702 using the parity data 502 in its storage subsystem 306 and the primary data 500b and up to 500n in its second buffer subsystem 308b (e.g., a CMB) in order to produce rebuilt primary data 500a, and then perform a write operation 704 to write the rebuilt primary data 500a in its second buffer subsystem 308b. As will be appreciated by one of skill in the art in possession of the present disclosure, the XOR operation 702 performed using the parity data 502 and the primary data 500b and up to 500n stored in the second buffer subsystem 308b may include any primary data provided by any currently available RAID primary data storage devices, and operates to rebuild the primary data 500a that became unavailable due to the failure of the RAID primary data storage device 206a.

Figure 7C:
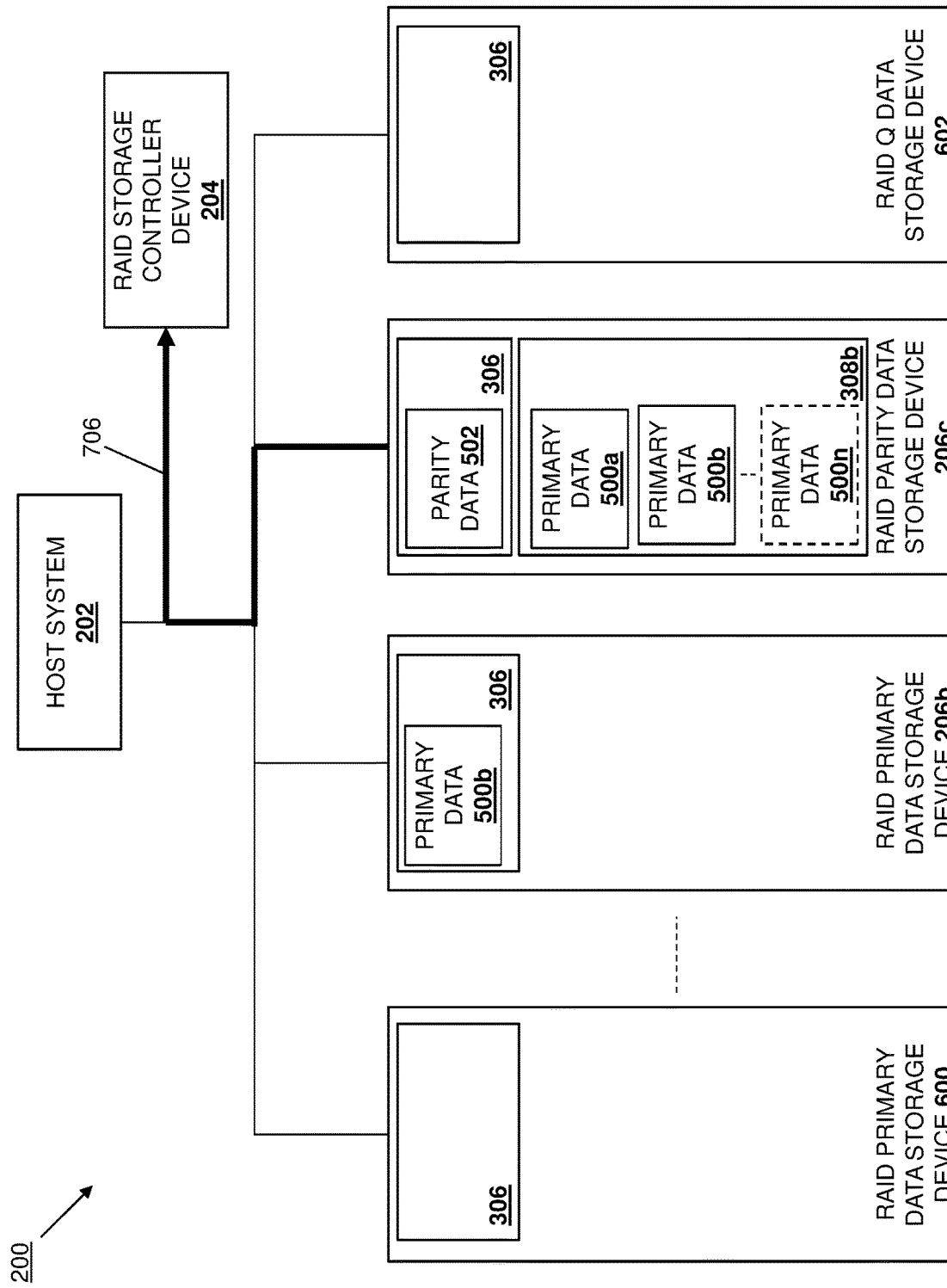
FIG. 7C is a schematic view illustrating an embodiment of the RAID storage system of FIG. 2 operating during the method of FIGS. 4A and 4B.

With reference to FIG. 7C, following completion of the operations associated with the command 700 (e.g., multiple operations associated with a multi-operation command as discussed above, following each operation associated with respective commands, etc.) the RAID storage engine 304 in the RAID parity data storage device 206c/300 may generate and transmit a completion message 706 to the RAID storage controller device 204. For example, the RAID storage engine 304 in the RAID parity data storage device 206c/300 may generate the completion message 706 and provide that completion message in a completion queue in its communication system 310, and then generate an interrupt to the RAID storage controller device 204 that causes the RAID storage controller device 204 to access that completion queue and retrieve the completion message. However, while a specific technique for transmitting the completion message is described, one of skill in the art in possession of the present disclosure will recognize that completion messages may be transmitted using a variety of other techniques while remaining within the scope of the present disclosure.

The method 400 then proceeds to block 410 where a second RAID primary data storage device receives a command from the RAID storage controller device. In an embodiment, at block 412, the RAID storage controller device 204 may generate and transmit a command to a RAID primary data storage device. For example, the RAID storage controller device 204 may determine that the completion message 706 was received from the RAID parity data storage device 206*c* as discussed above and, in response, at block 410 the RAID storage controller device 204 may generate a command 800 and transmit the command 800 to the RAID primary data storage device 600.

Similarly as discussed above, the command 800 may be a multi-operation command like those described in U.S. patent application Ser. No. 16/585,296, filed on Sep. 27, 2019. For example, the command 800 may be an NVMe WRITE multi-operation command that is configured to cause the RAID primary data storage device 600 to perform the multiple operations described below. However, while described as providing a multi-operation command at block 410, one of skill in the art in possession of the present disclosure will recognize that the multiple operations performed by the RAID primary data storage device 600 discussed below may be performed in response to respective commands transmitted by the RAID storage controller device 204 while remaining within the scope of the present disclosure as well. In a specific example, the transmission of the command 800 may include the RAID storage controller device 204 providing the command 800 in the submission queue that is included in the communication system 310 in the RAID primary data storage device 600/300, and then ringing a doorbell for the RAID primary data storage device 600/300. However, one of skill in the art in possession of the present disclosure will recognize that the command 800 may be provided to the RAID primary data storage device 600 in a variety of manners that will fall within the scope of the present disclosure as well.

As such, in some examples the RAID storage engine 304 in the RAID primary data storage device 600/300 may respond to the ringing of its doorbell by accessing the command 800 in the submission queue in its communication system 310. In embodiments in which the command 800 is a multi-operation command, the RAID storage engine 304 in the RAID primary data storage device 600/300 may identify the multiple operations instructed by that command 800 (as described in U.S. patent application Ser. No. 16/585,296, filed on Sep. 27, 2019.)

Figure 8A:
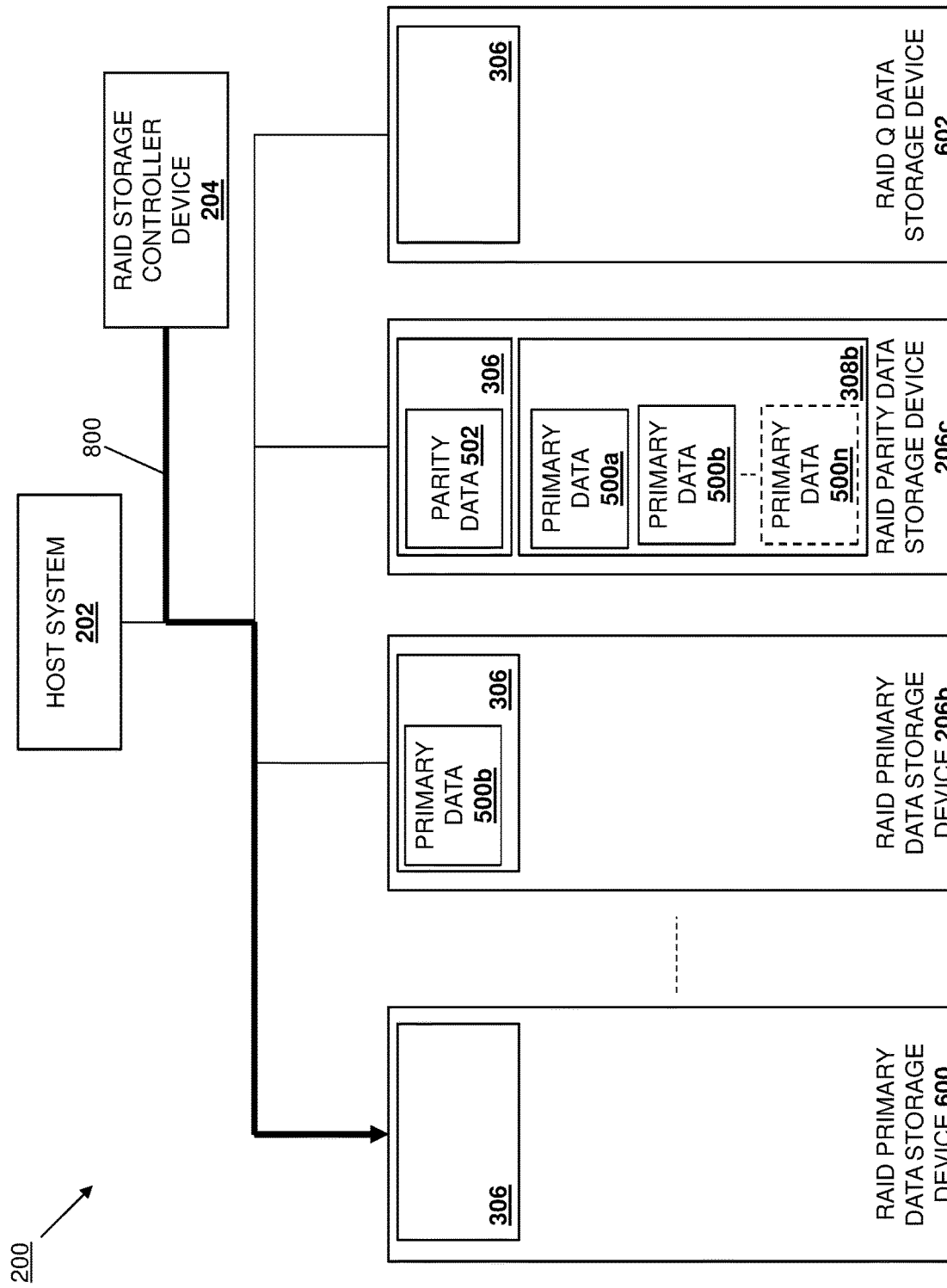
FIG. 8A is a schematic view illustrating an embodiment of the RAID storage system of FIG. 2 operating during the method of FIGS. 4A and 4B.
Figure 8B:
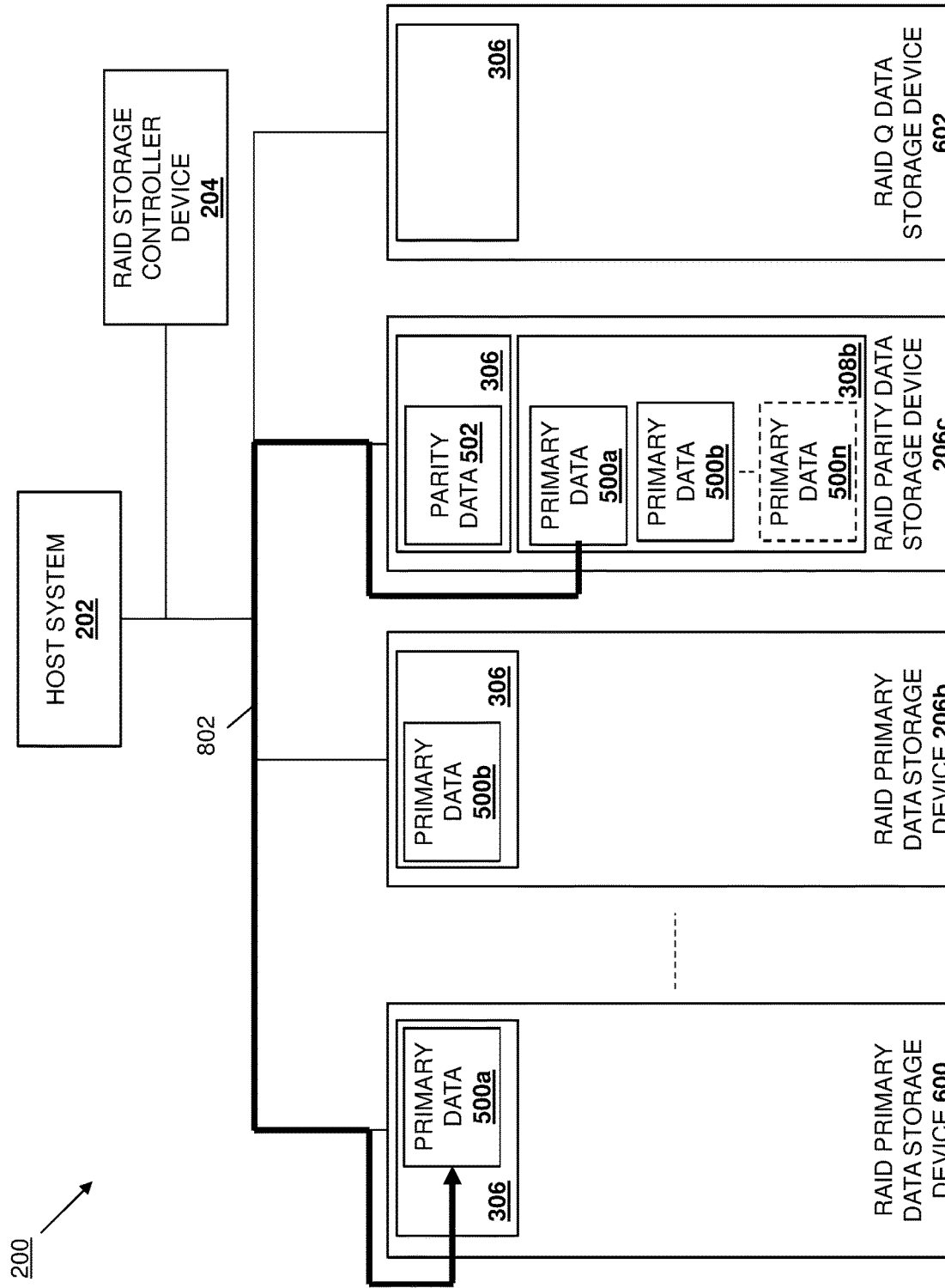
FIG. 8B is a schematic view illustrating an embodiment of the RAID storage system of FIG. 2 operating during the method of FIGS. 4A and 4B.

The method 400 then proceeds to block 412 where the second RAID primary data storage device writes the rebuilt primary data from the RAID parity data storage device to its buffer subsystem. With reference to FIG. 8B, in an embodiment of block 412, the RAID storage engine 304 in the RAID primary data storage device 600/300 may operate to access the rebuilt primary data 500*a* in the second buffer subsystem 308*b* in the RAID parity data storage device 206*c*, and perform a DMA operation 802 to write that rebuilt primary data 500*a* to its storage subsystem 306. As will be appreciated by one of skill in the art in possession of the present disclosure, the writing of the rebuilt primary data 500*a* to the RAID primary data storage device 600 provides for recovery from the failure of the RAID primary data storage device 206*a*, as the writing of the rebuilt primary data 500*a* to the RAID primary data storage device 600 provides all of the RAID primary data storage devices 600 and up to 206*b* with the same primary data as that which was stored by the RAID primary data storage devices prior to the failure of the RAID primary data storage device 500*a*.

Figure 8C:
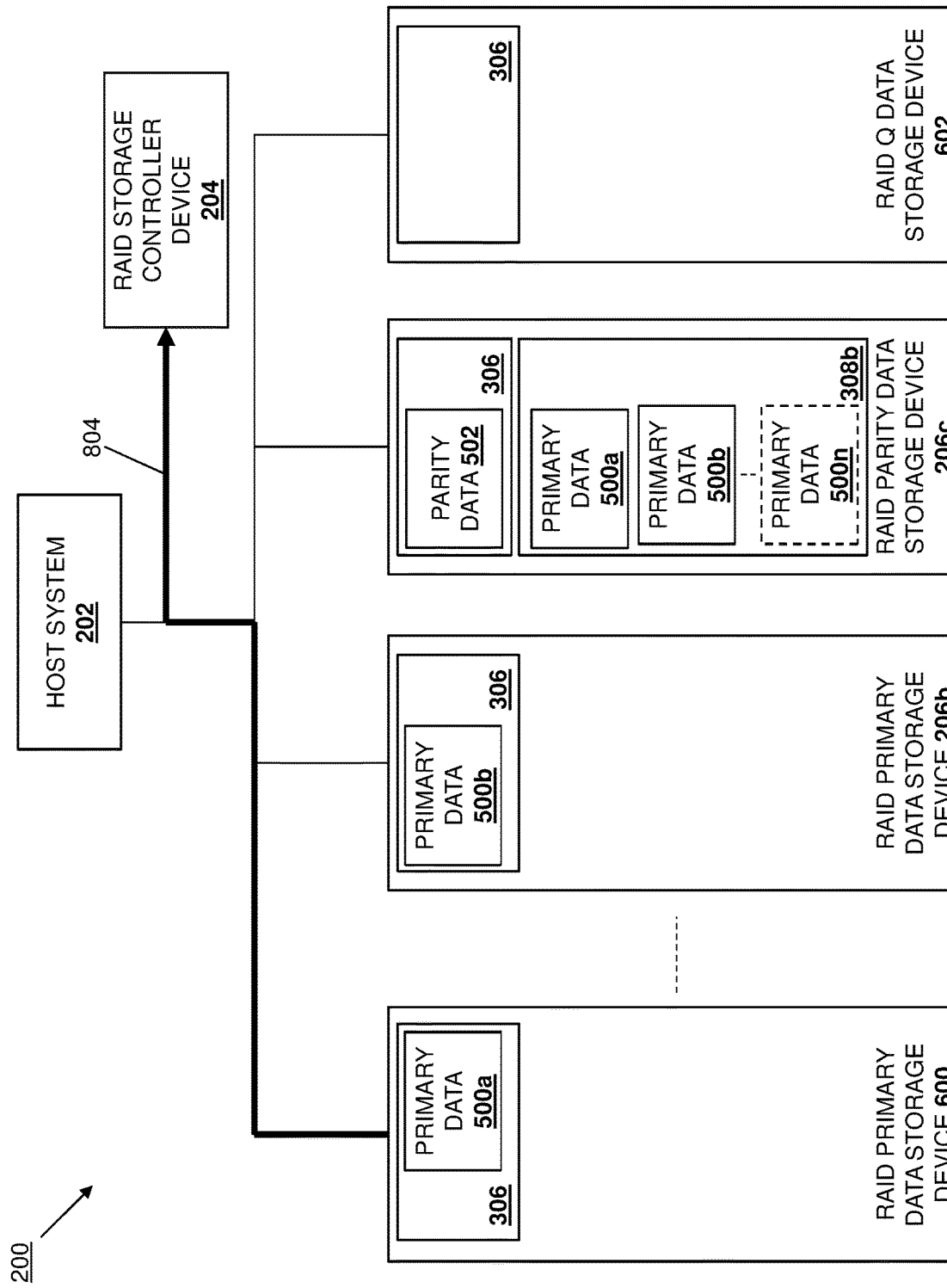
FIG. 8C is a schematic view illustrating an embodiment of the RAID storage system of FIG. 2 operating during the method of FIGS. 4A and 4B.

With reference to FIG. 8C, following completion of the operations associated with the command 800 (e.g., multiple operations associated with a multi-operation command as discussed above, following each operation associated with respective commands, etc.) the RAID storage engine 304 in the RAID primary data storage device 600/300 may generate and transmit a completion message 804 to the RAID storage controller device 204. For example, the RAID storage engine 304 in the RAID primary data storage device 600/300 may generate the completion message 804 and provide that completion message in a completion queue in its communication system 310, and then generate an interrupt to the RAID storage controller device 204 that causes the RAID storage controller device 204 to access that completion queue and retrieve the completion message. However, while a specific technique for transmitting the completion message is described, one of skill in the art in possession of the present disclosure will recognize that completion messages may be transmitted using a variety of other techniques while remaining within the scope of the present disclosure.

The method 400 then proceeds to block 414 where the RAID parity data storage device receives a command from the RAID storage controller device. In an embodiment, at block 414, the RAID storage controller device 204 may generate and transmit a command to a RAID parity data storage device. For example, the RAID storage controller device 204 may determine that the completion message 804 was received from the RAID primary data storage device 600 as discussed above and, in response, at block 414 the RAID storage controller device 204 may generate a command 900 and transmit the command 900 to the RAID parity data storage device 206*c*.

Similarly as discussed above, the command 900 may be a multi-operation command like those described in U.S. patent application Ser. No. 16/585,296, filed on Sep. 27, 2019. For example, the command 900 may be an NVMe GENERATE Q multi-operation command that is configured to cause the RAID parity data storage device 206*c* to perform the multiple operations described below. However, while described as providing a multi-operation command at block 414, one of skill in the art in possession of the present disclosure will recognize that the multiple operations performed by the RAID parity data storage device 206*c* discussed below may be performed in response to respective commands transmitted by the RAID storage controller device 204 while remaining within the scope of the present disclosure as well. In a specific example, the transmission of the command 900 may include the RAID storage controller device 204 providing the command 900 in the submission queue that is included in the communication system 310 in the RAID parity data storage device 206*c*/300, and then ringing a doorbell for the RAID parity data storage device 206*c*/300. However, one of skill in the art in possession of the present disclosure will recognize that the command 900 may be provided to the RAID parity data storage device 206*c* in a variety of manners that will fall within the scope of the present disclosure as well.

As such, in some examples the RAID storage engine 304 in the RAID parity data storage device 206*c*/300 may respond to the ringing of its doorbell by accessing the command 900 in the submission queue in its communication system 310. In embodiments in which the command 900 is a multi-operation command, the RAID storage engine 304 in the RAID parity data storage device 206*c*/300 may identify the multiple operations instructed by that command 900 (as described in U.S. patent application Ser. No. 16/585,296, filed on Sep. 27, 2019.)

The method 400 then proceeds to block 416 where the RAID parity data storage device performs Galois Field (GF) operations on the primary data to produce GF primary data. In some embodiments, the command 900 may include an index into a log table and an inverse log table that provides for the retrieval of GF multiplicands and GF results, respectively. For example, the RAID storage engine 304 in the RAID parity data storage device 206c/300 may access an index into a log table that is located in the RAID storage database 309 in the RAID parity data storage device 206c/300 and that includes respective drive multiplicands used with GF operations, and use that index to retrieve GF multiplicands (e.g., gfLg, gfiLg, etc.) for use in performing GF operations that one of skill in the art in possession of the present disclosure would recognize are commonly utilized with RAID 6 configurations. As will be appreciated by one of skill in the art in possession of the present disclosure, the RAID storage engine 304 in the RAID parity data storage device 206c/300 may also access the index into an inverse log table that is located in the RAID storage database 309 in the RAID parity data storage device 206c/300 and that references final values derived from GF operations. The generation of such GF multiplicands and inverse log tables is outside the scope of the present disclosure, but one of skill in the art in possession of the present disclosure will recognize how an inverse log table with such GF multiplicands may be generated for the RAID storage system 200 while remaining within the scope of the present disclosure. Furthermore, while particular GF operations are illustrated and described herein, one of skill in the art in possession of the present disclosure will recognize that other operations may be performed at block 416 while remaining within the scope of the present disclosure as well.

Figure 9A:
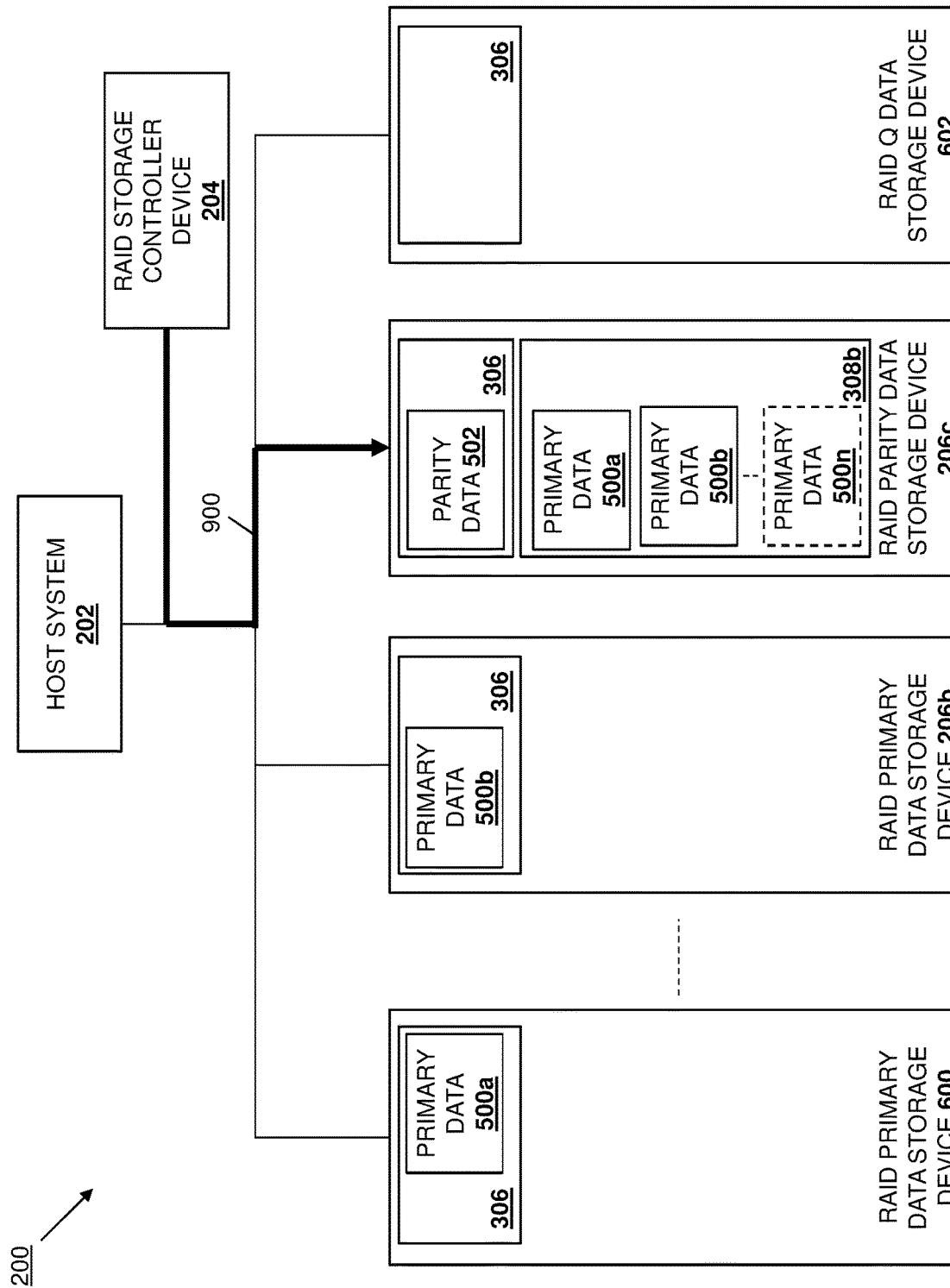
FIG. 9A is a schematic view illustrating an embodiment of the RAID storage system of FIG. 2 operating during the method of FIGS. 4A and 4B.
Figure 9B:
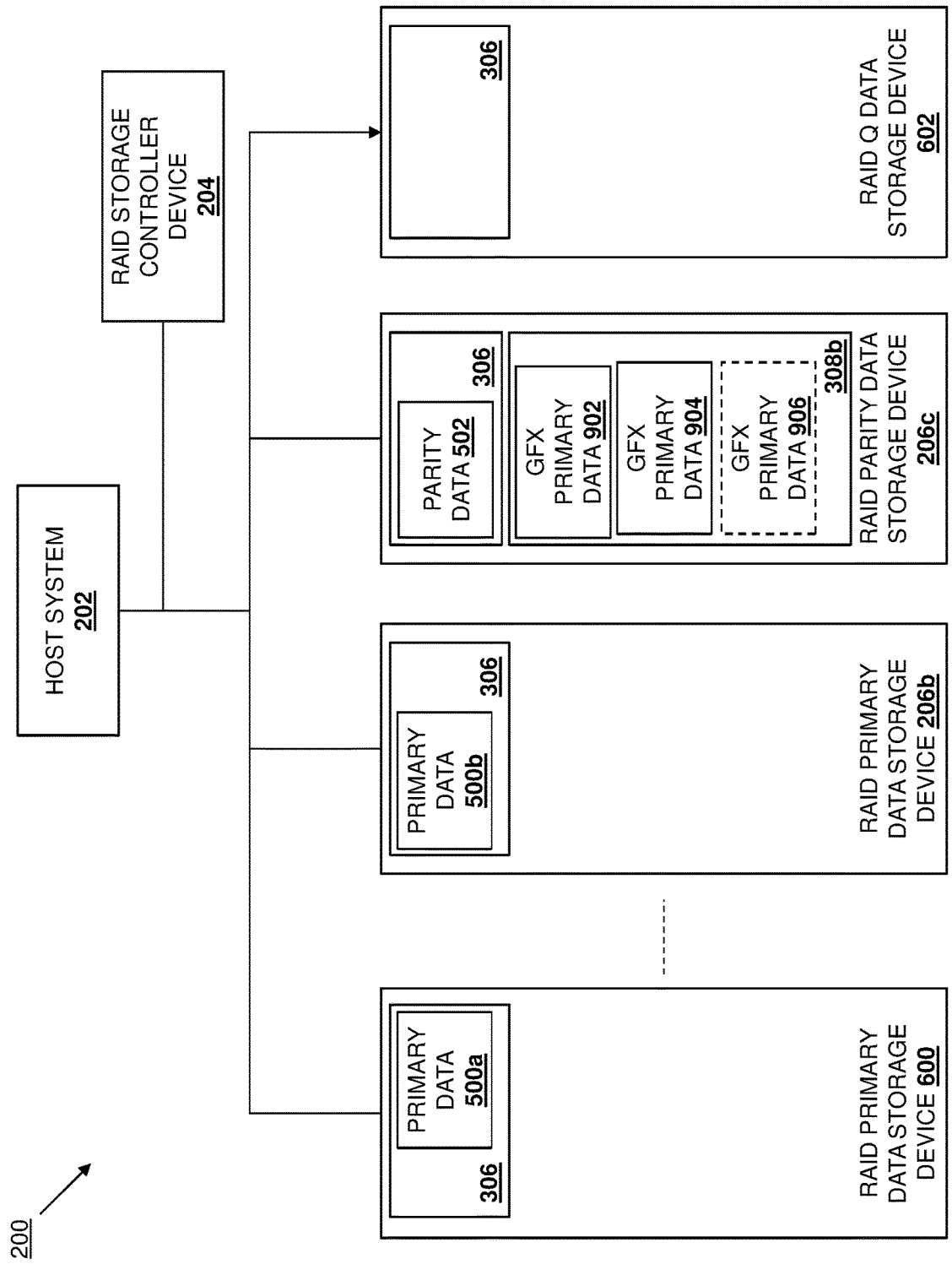
FIG. 9B is a schematic view illustrating an embodiment of the RAID storage system of FIG. 2 operating during the method of FIGS. 4A and 4B.

As such, with reference to FIGS. 9A and 9B and in an embodiment of block 416, the RAID storage engine 304 in the RAID parity data storage device 206c/300 may utilize GF multiplicands retrieved using the command 900 to perform GF operations on the rebuilt parity data 500a in its second buffer subsystem 308b to produce GFX primary data 902 (e.g., interim parity data that has been GF multiplied by its respective GF multiplicand), perform GF operations on the primary data 500b in its second buffer subsystem 308b to produce GFX primary data 904, and perform GF operations on the primary data 500n in its second buffer subsystem 308b to produce GFX primary data 906. As such, following block 414, the second buffer subsystem 308b in the RAID parity data storage device 206c may store the GFX primary data 902, 904, and 906 produced via the GF operations.

Figure 9C:
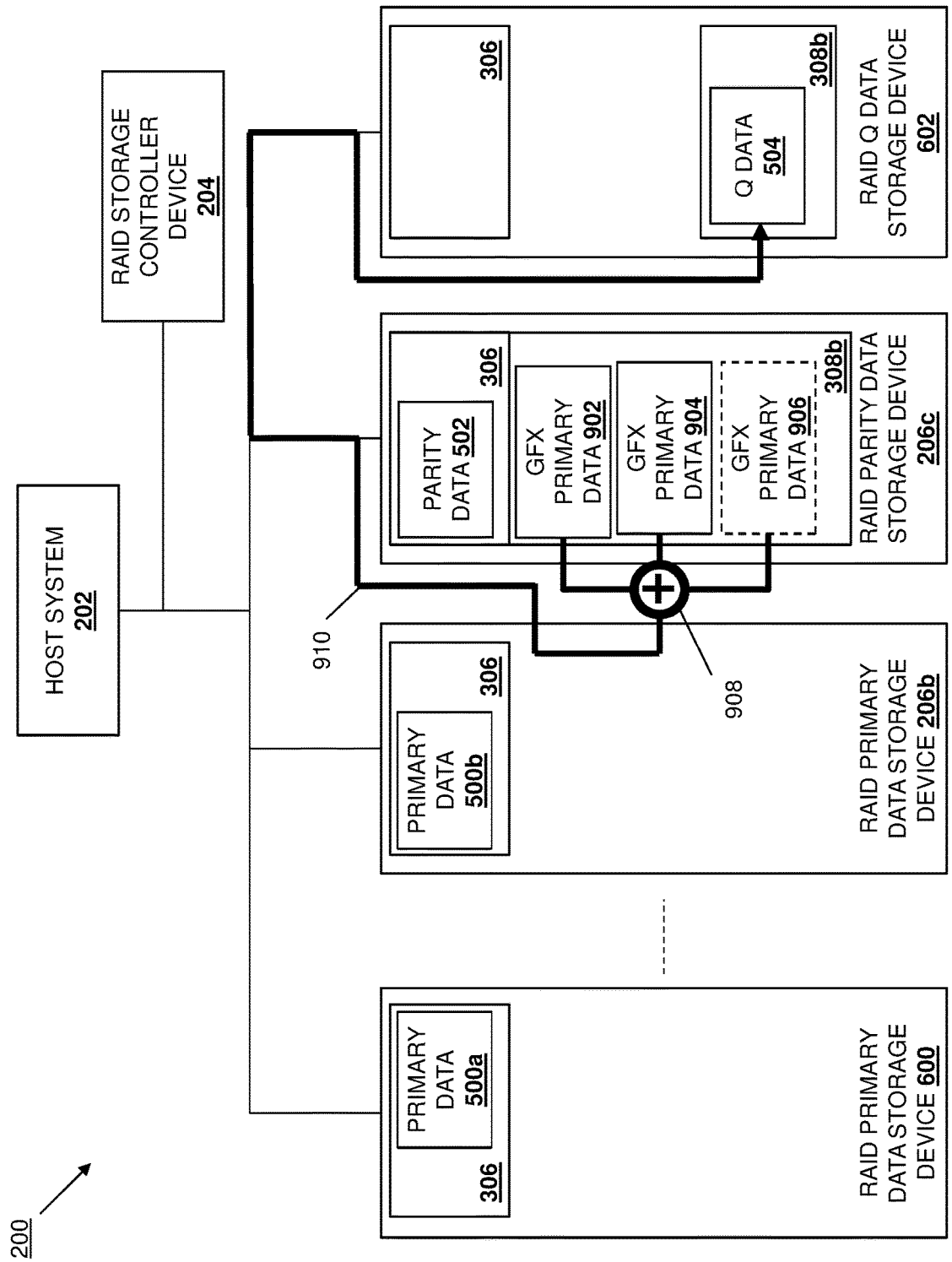
FIG. 9C is a schematic view illustrating an embodiment of the RAID storage system of FIG. 2 operating during the method of FIGS. 4A and 4B.

The method 400 then proceeds to block 418 where the RAID parity data storage device performs an XOR operation on the GF primary data to produce rebuilt Q data, and writes the rebuilt Q data to a RAID Q data storage device. With reference to FIG. 9C, in an embodiment of block 418 and based on the command 900 (which is a multi-operation command as described above in this embodiment), the RAID storage engine 304 in the RAID parity data storage device 206c/300 may operate to perform an XOR operation 908 using the GFX primary data 902, 904, and 906 in its second buffer subsystem 308b in order to produce rebuilt Q data 504, and then perform a DMA operation 910 that writes that rebuilt Q data 504 to the second buffer subsystem 308b (e.g., a CMB) in the RAID Q data storage device 602. As will be appreciated by one of skill in the art in possession of the present disclosure, the rebuilt Q data 504 may allow for the recovery of unavailable primary data and, in some cases, unavailable parity data, in any two of the RAID primary data storage devices 600 and up to 206b, and in some cases, the RAID parity data storage device 206c.

Figure 9D:
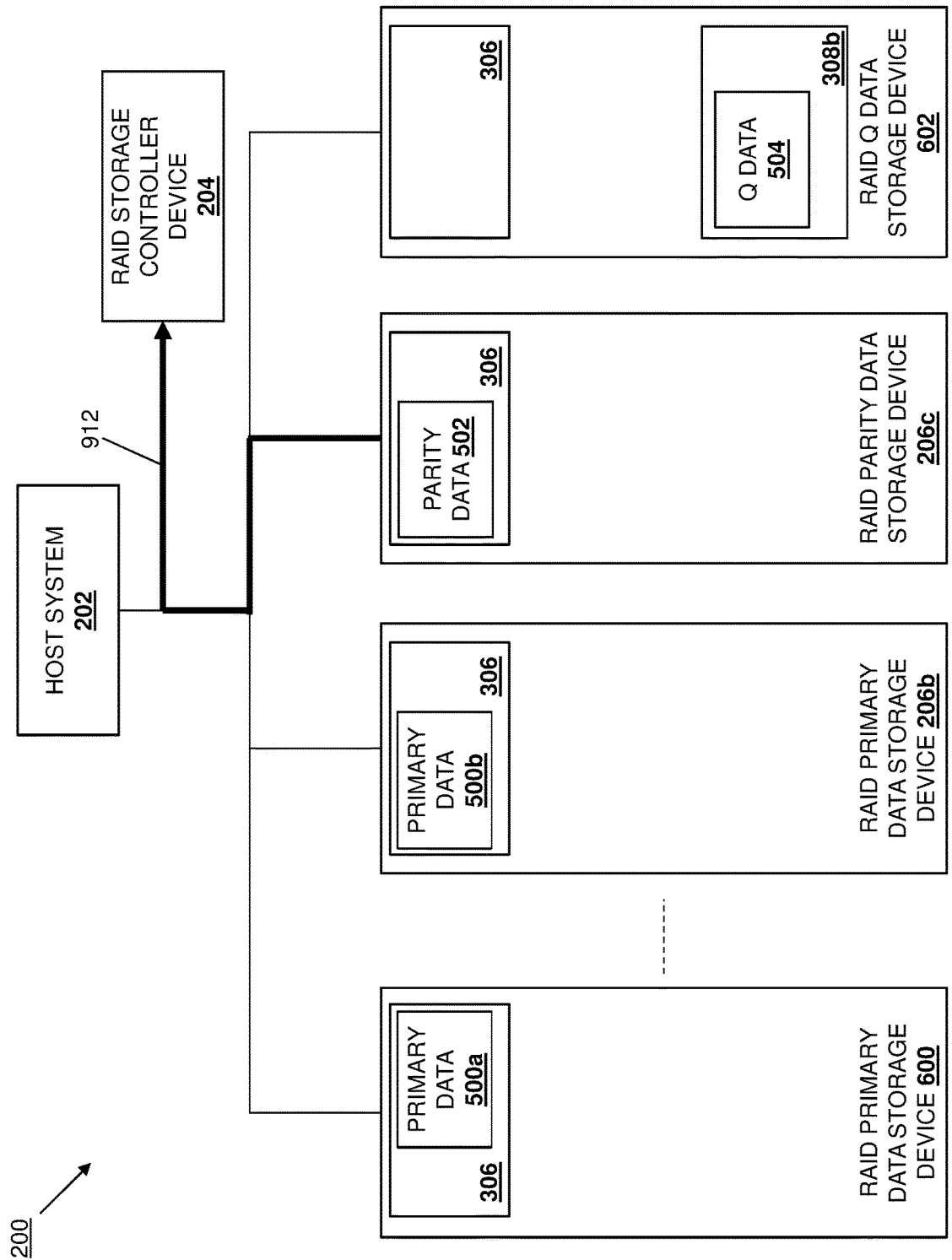
FIG. 9D is a schematic view illustrating an embodiment of the RAID storage system of FIG. 2 operating during the method of FIGS. 4A and 4B.

With reference to FIG. 9D, following completion of the operations associated with the command 900 (e.g., multiple operations associated with a multi-operation command as discussed above, following each operation associated with respective commands, etc.) the RAID storage engine 304 in the RAID parity data storage device 206c/300 may generate and transmit a completion message 912 to the RAID storage controller device 204. For example, the RAID storage engine 304 in the RAID parity data storage device 206c/300 may generate the completion message 912 and provide that completion message in a completion queue in its communication system 310, and then generate an interrupt to the RAID storage controller device 204 that causes the RAID storage controller device 204 to access that completion queue and retrieve the completion message. However, while a specific technique for transmitting the completion message is described, one of skill in the art in possession of the present disclosure will recognize that completion messages may be transmitted using a variety of other techniques while remaining within the scope of the present disclosure. In some embodiments, following completion of the operations associated with the command 900, the RAID storage engine 304 in the RAID parity data storage device 206c may operate to clear data (e.g., the primary data and GFX primary data) from its second buffer subsystem 308b.

The method 400 then proceeds to block 420 where the RAID Q data storage device receives a command from the RAID storage controller device. In an embodiment, at block 420, the RAID storage controller device 204 may generate and transmit a command to a RAID Q data storage device. For example, the RAID storage controller device 204 may determine that the completion message 912 was received from the RAID parity data storage device 206c as discussed above and, in response, at block 420 the RAID storage controller device 204 may generate a command 1000 and transmit the command 1000 to the RAID Q data storage device 206d. One of skill in the art in possession of the present disclosure will recognize that, in the example below, the command 1000 is described as a conventional write command. However, the utilization at block 420 of the multi-operation commands discussed above will fall within the scope of the present disclosure as well. In a specific example, the transmission of the command 1000 may include the RAID storage controller device 204 providing the command 1000 in the submission queue that is included in the communication system 310 in the RAID Q data storage device 206d/300, and then ringing a doorbell for the RAID Q data storage device 206d/300. However, one of skill in the art in possession of the present disclosure will recognize that the command 1000 may be provided to the RAID Q data storage device 206d in a variety of manners that will fall within the scope of the present disclosure as well. As such, in some examples the RAID storage engine 304 in the RAID Q data storage device 206d/300 may respond to the ringing of its doorbell by accessing the command 1000 in the submission queue in its communication system 310.

Figure 10A:
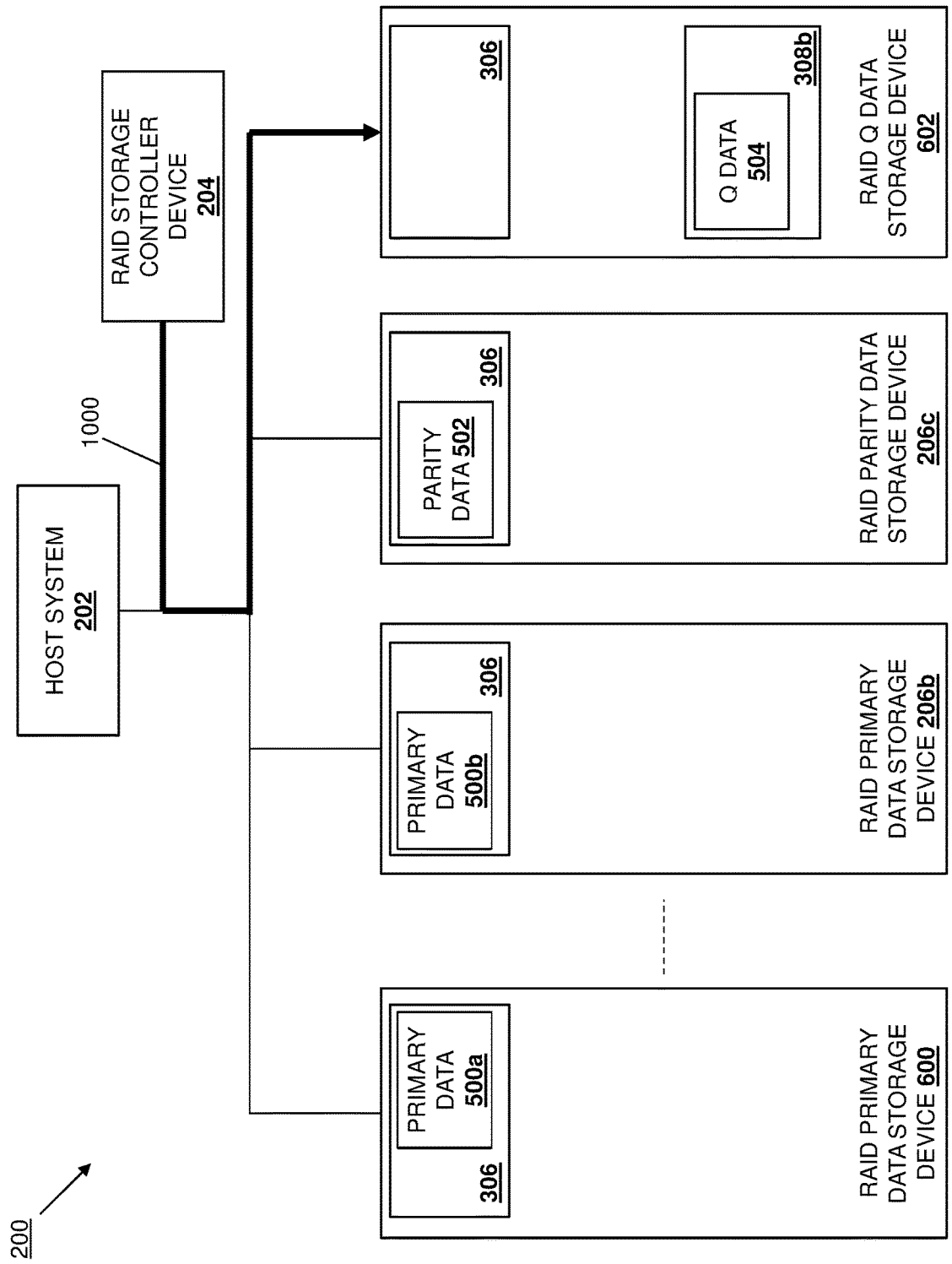
FIG. 10A is a schematic view illustrating an embodiment of the RAID storage system of FIG. 2 operating during the method of FIGS. 4A and 4B.
Figure 10B:
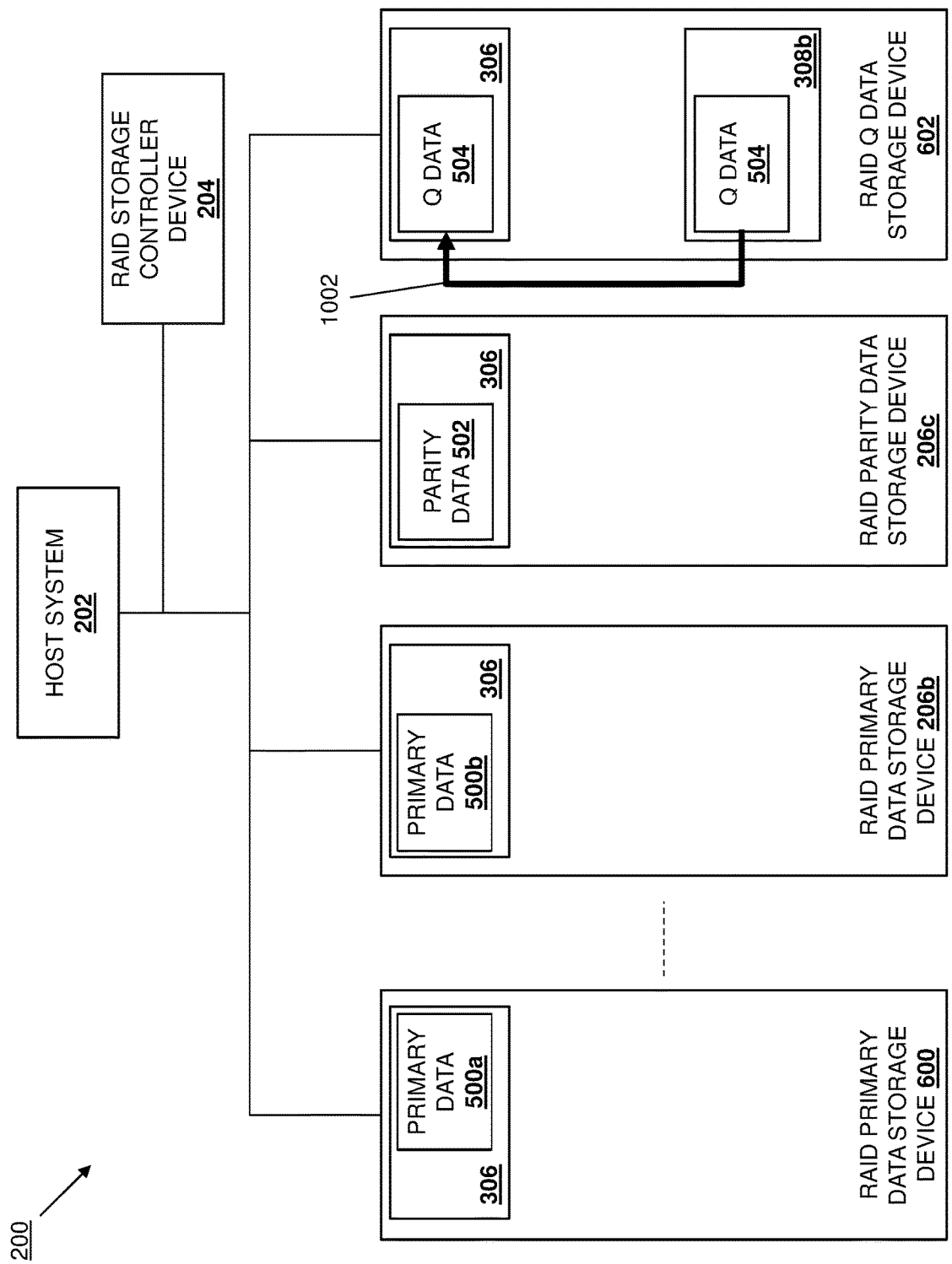
FIG. 10B is a schematic view illustrating an embodiment of the RAID storage system of FIG. 2 operating during the method of FIGS. 4A and 4B.
Figure 10C:
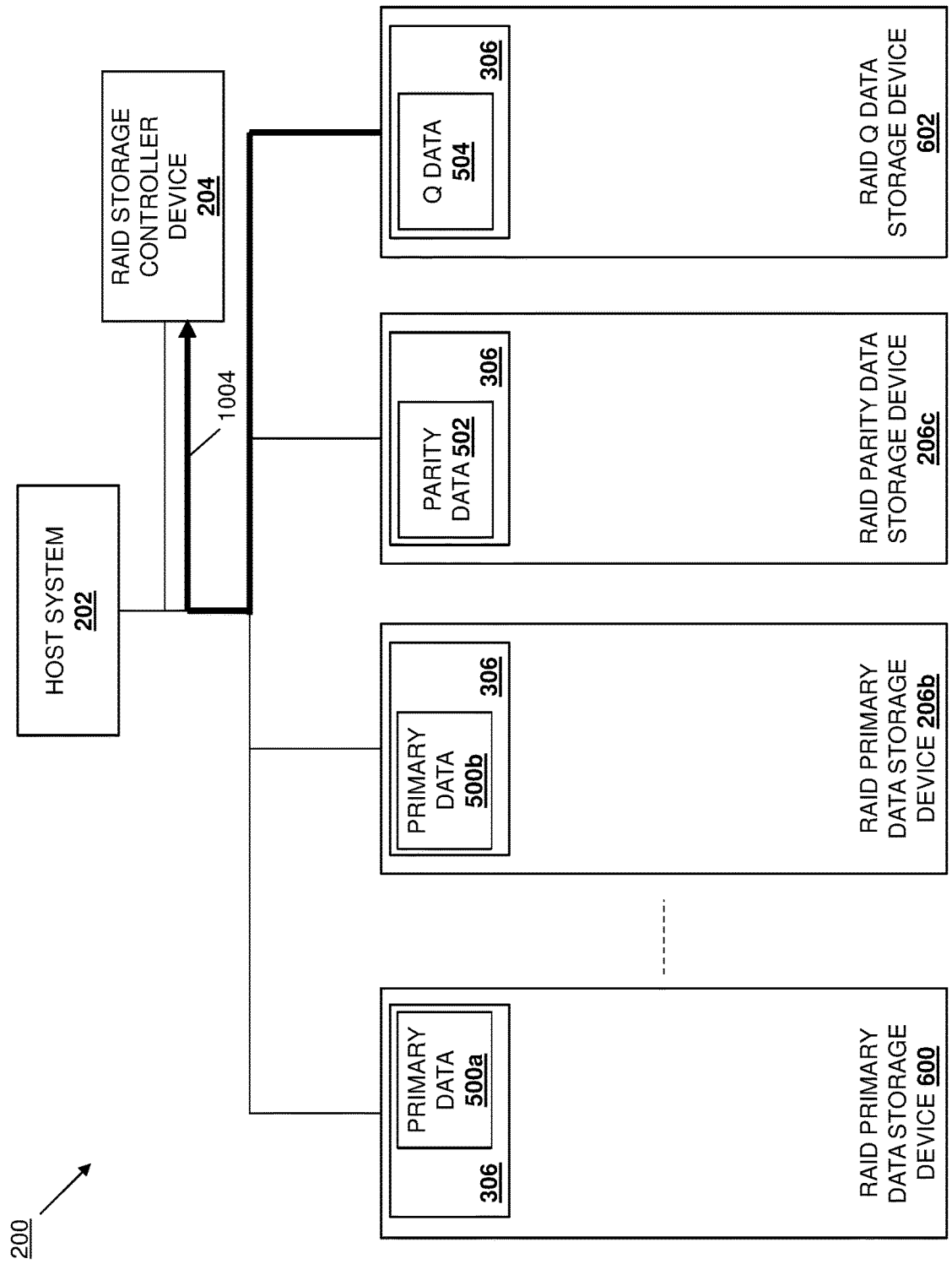

The method 400 then proceeds to block 422 where the RAID Q data storage device writes the rebuilt Q data to its storage subsystem. With reference to FIG. 10B, in an embodiment of block 422 and based on the command 1000, the RAID storage engine 304 in the RAID Q data storage device 206d/300 may operate to perform a write operation 1002 to write the rebuilt Q data 504 to its storage subsystem 306. As will be appreciated by one of skill in the art in possession of the present disclosure, the writing of the rebuilt Q data 504 to the RAID Q data storage device 602 provides for recovery from the failure of the RAID Q data storage device 206d, as the writing of the rebuilt Q data 504 to the RAID Q data storage device 602 provides the RAID Q data storage devices 602 with the same Q data as that which was stored prior to the failure of the RAID primary data storage device 504.

With reference to FIG. 100, following completion of the operations associated with the command 1000 (e.g., multiple operations associated with a multi-operation command as discussed above, following each operation associated with respective commands, etc.) the RAID storage engine 304 in the RAID Q data storage device 206d/300 may generate and transmit a completion message 1004 to the RAID storage controller device 204. For example, the RAID storage engine 304 in the RAID Q data storage device 206d/300 may generate the completion message 1004 and provide that completion message in a completion queue in its communication system 310, and then generate an interrupt to the RAID storage controller device 204 that causes the RAID storage controller device 204 to access that completion queue and retrieve the completion message. However, while a specific technique for transmitting the completion message is described, one of skill in the art in possession of the present disclosure will recognize that completion messages may be transmitted using a variety of other techniques while remaining within the scope of the present disclosure.

Thus, systems and methods have been described that provide for the performance of unavailable primary data/Q data rebuild operations to rebuild and backup data in a RAID storage system with the assistance of the RAID storage devices that store that data. For example, a first RAID primary data storage device provides primary data to a first buffer subsystem in A RAID parity data storage device via first DMA operations. The RAID parity data storage device may then perform an XOR operation on first parity data in a first storage subsystem in the RAID parity data storage device and the primary data in the first buffer subsystem to produce rebuilt primary data, and store that rebuilt primary data in a buffer subsystem in the RAID parity data storage device. A second RAID primary data storage device may then retrieve the rebuilt primary data from the buffer subsystem in the RAID parity data storage device via a second DMA operation, and store that rebuilt parity data in a second storage subsystem in the second RAID primary data storage device. The RAID parity data storage device may then perform Galois Field (GF) operations on the rebuilt primary data and other primary data in the first buffer subsystem to produce GF primary data, perform an XOR operation on the GF primary data to produce Q data, and write the Q data to a third buffer subsystem in a RAID Q data storage device. The RAID Q data storage device may then provide the Q data in a third storage subsystem in the RAID Q data storage device. As such, unavailable primary data may be rebuilt, and in the event Q data is also unavailable, the RAID storage subsystem may take advantage of the available and rebuilt primary data to rebuilt that unavailable Q data as well, with the unavailable primary data/Q data rebuilt operations off-loaded from the RAID storage controller device, thus increasing the ability of the RAID storage controller device to scale with high performance RAID storage devices.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A Redundant Array of Independent Disk (RAID) storage-device-assisted unavailable primary data/Q data rebuild system, comprising:

a Redundant Array of Independent Disk (RAID) storage controller device; and a plurality of RAID storage devices that are each coupled to the RAID storage controller device, wherein the plurality of RAID storage devices include:
  a first RAID primary data storage device that includes a first storage subsystem storing first primary data, wherein the first RAID primary data storage device is configured, in response to a first command received from the RAID storage controller device, to:
    write, via a first Direct Memory Access (DMA) operation to a second buffer subsystem in a RAID parity data storage device that is included in the plurality of RAID storage devices, the first primary data from the first storage subsystem;
  the RAID parity data storage device that includes a second storage subsystem storing first parity data and the second buffer subsystem storing the first primary data written by the first RAID primary data storage device and second primary data, wherein the RAID parity data storage device is configured, in response to a second command received from the RAID storage controller device, to:
    perform an XOR operation on the first parity data in the second storage subsystem and the first primary data and the second primary data in the second buffer subsystem to produce third primary data;
    write, to the second buffer subsystem, the third primary data;
  a second RAID primary data storage device that includes a third storage subsystem, wherein the second RAID primary data storage device is configured, in response to a third command received from the RAID storage controller device, to:
    write, via a second DMA operation from the second buffer subsystem in the RAID parity data storage device, the third primary data to the third storage subsystem;
  wherein the RAID parity data storage device is configured, in response to a fourth command received from the RAID storage controller device, to:
    perform Galois Field (GF) operations on the first primary data, the second primary data, and the third primary data in the second buffer subsystem to produce first GF primary data, second GF primary data, and third GF primary data;
    perform an XOR operation on the first GF primary data, second GF primary data, and third GF primary data to produce first Q data; and
    write, via a third DMA operation to a third buffer subsystem in a RAID Q data storage device that is included in the plurality of RAID storage devices, the first Q data; and
  the RAID Q data storage device that includes a fourth storage subsystem and the third buffer subsystem storing the first Q data written by the RAID parity data storage device, wherein the RAID Q data storage device is configured, in response to a fifth command received from the RAID storage controller device, to:
    write, to the fourth storage subsystem, the first Q data from the third buffer subsystem.

2. The system of claim 1, wherein the plurality of RAID storage devices include:
a third RAID primary data storage device that includes a fifth storage subsystem storing the second primary data, wherein the third RAID primary data storage device is configured, in response to a sixth command received from the RAID storage controller device, to:
write, via a fourth DMA operation to the second buffer subsystem in the RAID parity data storage device, the second primary data from the fifth storage subsystem.

3. The system of claim 1, wherein the second buffer subsystem is a Controller Memory Buffer (CMB) included in the RAID parity data storage device, and the third buffer subsystem is a CMB included in the RAID Q data storage device.

4. The system of claim 1, wherein the first RAID primary data storage device is configured, in response writing the first primary data to the second buffer subsystem in the RAID parity data storage device, to:
provide a completion message to the RAID storage controller device, wherein the RAID storage controller device is configured to:
provide the second command to the RAID parity data storage device in response to receiving the completion message.

5. The system of claim 1, wherein the RAID parity data storage device is configured, in response to writing the third primary data to the second buffer subsystem in the RAID parity data storage device, to:
provide a completion message to the RAID storage controller device, wherein RAID storage controller device is configured to:
provide the third command to the second RAID primary data storage device in response to receiving the completion message.

6. The system of claim 1, wherein the RAID parity data storage device is configured, in response to writing the first Q data to the third buffer subsystem in the RAID Q data storage device, to:
provide a completion message to the RAID storage controller device, wherein RAID storage controller device is configured to:
provide the fifth command to the RAID Q data storage device in response to receiving the completion message.

7. An Information Handling System (IHS), comprising:
a first Redundant Array of Independent Disk (RAID) primary data storage device that includes a first storage subsystem storing first primary data, wherein the first RAID primary data storage device is configured, in response to a first command received from a RAID storage controller device, to:
write, via a first Direct Memory Access (DMA) operation to a second buffer subsystem in a RAID parity data storage device, the first primary data from the first storage subsystem;
the RAID parity data storage device that includes a second storage subsystem storing first parity data and the second buffer subsystem storing the first primary data written by the first RAID primary data storage device and second primary data, wherein the RAID parity data storage device is configured, in response to a second command received from the RAID storage controller device, to:
perform an XOR operation on the first parity data in the second storage subsystem and the first primary data and the second primary data in the second buffer subsystem to produce third primary data;
write, to the second buffer subsystem, the third primary data;
a second RAID primary data storage device that includes a third storage subsystem, wherein the second RAID primary data storage device is configured, in response to a third command received from the RAID storage controller device, to:
write, via a second DMA operation from the second buffer subsystem in the RAID parity data storage device, the third primary data to the third storage subsystem;
wherein the RAID parity data storage device is configured, in response to a fourth command received from the RAID storage controller device, to:
perform Galois Field (GF) operations on the first primary data, the second primary data, and the third primary data in the second buffer subsystem to produce first GF primary data, second GF primary data, and third GF primary data;
perform an XOR operation on the first GF primary data, second GF primary data, and third GF primary data to produce second first Q data; and
write, via a third DMA operation to a third buffer subsystem in a RAID Q data storage device, the first Q data; and
the RAID Q data storage device that includes a fourth storage subsystem and the third buffer subsystem storing the first Q data written by the RAID parity data storage device, wherein the RAID Q data storage device is configured, in response to a fifth command received from the RAID storage controller device, to:
write, to the fourth storage subsystem, the first Q data from the fourth third buffer subsystem.

8. The IHS of claim 7, further comprising:
a third RAID primary data storage device that includes a fifth storage subsystem storing the second primary data, wherein the third RAID primary data storage device is configured, in response to a sixth command received from the RAID storage controller device, to:
write, via a fourth DMA operation to the second buffer subsystem in the RAID parity data storage device, the second primary data from the fifth storage subsystem.

9. The IHS of claim 7, wherein the second buffer subsystem is a Controller Memory Buffer (CMB) included in the RAID parity data storage device, and the third buffer subsystem is a CMB included in the RAID Q data storage device.

10. The IHS of claim 7, wherein the first RAID primary data storage device is configured, in response writing the first primary data to the second buffer subsystem in the RAID parity data storage device, to:
provide a completion message to the RAID storage controller device, wherein the RAID storage controller device provides the second command to the RAID parity data storage device in response to receiving the completion message.

11. The IHS of claim 7, wherein the RAID parity data storage device is configured, in response to writing the third primary data to the second buffer subsystem in the RAID parity data storage device, to:
provide a completion message to the RAID storage controller device, wherein RAID storage controller device provides the third command to the second RAID primary data storage device in response to receiving the completion message.

12. The IHS of claim 7, wherein the RAID parity data storage device is configured, in response to writing the first Q data to the third buffer subsystem in the RAID Q data storage device, to:
provide a completion message to the RAID storage controller device, wherein RAID storage controller device provides the fifth command to the RAID Q data storage device in response to receiving the completion message.

13. The IHS of claim 7, wherein the RAID parity data storage device is configured, in response to writing the first Q data to the third buffer subsystem in the RAID Q data storage device, to:
clear the first primary data, the second primary data, and the third primary data from the second buffer subsystem.

14. A method for assisting with unavailable primary data/Q data rebuild operations using Redundant Array of Independent Disk (RAID) storage devices, comprising:
receiving, by a first Redundant Array of Independent Disk (RAID) primary data storage device, a first command from a RAID storage controller device and, in response:
writing, by the first RAID primary data storage device via a first Direct Memory Access (DMA) operation to a second buffer subsystem in a RAID parity data storage device, first primary data from a first storage subsystem in the first RAID primary data storage device;
receiving, by the RAID parity data storage device, a second command from the RAID storage controller device and, in response:
performing, by the RAID parity data storage device, an XOR operation on first parity data in a second storage subsystem in the RAID parity data storage device and the first primary data and second primary data in the second buffer subsystem to produce third primary data;
writing, by the RAID parity data storage device to the second buffer subsystem, the third primary data;
receiving, by a second RAID primary data storage device, a third command from the RAID storage controller device and, in response:
writing, by the second RAID primary data storage device via a second DMA operation from the second buffer subsystem in the RAID parity data storage device, the third primary data to a third storage subsystem in the second RAID primary data storage device;
receiving, by the RAID parity data storage device, a fourth command from the RAID storage controller device and, in response:
performing, by the RAID parity data storage device, Galois Field (GF) operations on the first primary data, the second primary data, and the third primary data in the second buffer subsystem to produce first GF primary data, second GF primary data, and third GF primary data;
performing, by the RAID parity data storage device, an XOR operation on the first GF primary data, second GF primary data, and third GF primary data to produce first Q data; and
writing, by the RAID parity data storage device via a third DMA operation to a third buffer subsystem in a RAID Q data storage device, the first Q data; and
receiving, by the RAID Q data storage device, a fifth command from the RAID storage controller device and, in response:
writing, to a fourth storage subsystem in the RAID Q data storage device, the first Q data from the third buffer subsystem.

15. The method of claim 14, further comprising:
receiving, by a third RAID primary data storage device from the RAID storage controller device, a sixth command and, in response:
writing, by the second RAID primary data storage device via a fourth DMA operation to the second buffer subsystem in the RAID parity data storage device, the second primary data from a fifth storage subsystem in the second RAID primary data storage device.

16. The method of claim 14, wherein the second buffer subsystem is a Controller Memory Buffer (CMB) included in the RAID parity data storage device, and the third buffer subsystem is a CMB included in the RAID Q data storage device.

17. The method of claim 14, further comprising:
providing, by the first RAID primary data storage device in response writing the first primary data to the second buffer subsystem in the RAID parity data storage device, a completion message to the RAID storage controller device; and
providing, by the RAID storage controller device in response to receiving the completion message, the second command to the RAID parity data storage device.

18. The method of claim 14, further comprising:
providing, by the RAID parity data storage device in response to writing the third primary data to the second buffer subsystem in the RAID parity data storage device, a completion message to the RAID storage controller device; and
providing, by the RAID storage controller device in response to receiving the completion message, the third command to the second RAID primary data storage device.

19. The method of claim 14, further comprising:
providing, by the RAID parity data storage device in response to writing the first Q data to the third buffer subsystem in the RAID Q data storage device, a completion message to the RAID storage controller device; and
providing, by the RAID storage controller device in response to receiving the completion message, the fifth command to the RAID Q data storage device.

20. The method of claim 19, further comprising:
clearing, by the RAID parity data storage device in response to writing the first Q data to the third buffer subsystem in the RAID Q data storage device, the first primary data, the second primary data, and the third primary data from the second buffer subsystem.

* * * * *

UNITED STATES PATENT AND TRADEMARK OFFICE
CERTIFICATE OF CORRECTION

| | |
|---|---|
| PATENT NO. | : 11,340,989 B2 |
| APPLICATION NO. | : 16/586152 |
| DATED | : May 24, 2022 |
| INVENTOR(S) | : Kotzur et al. |

Page 1 of 1

It is certified that error appears in the above-identified patent and that said Letters Patent is hereby corrected as shown below:

In the Claims

Claim 7, Column 20, Line 25, "to produce second first Q data; and" should read --to produce first Q data; and--;

Claim 7, Column 20, Line 37, "from the fourth third buffer subsystem." should read --from the third buffer subsystem.--.

Signed and Sealed this
Sixteenth Day of August, 2022

Katherine Kelly Vidal
*Director of the United States Patent and Trademark Office*